United States Patent
Otani et al.

(10) Patent No.: US 12,482,732 B2
(45) Date of Patent: Nov. 25, 2025

(54) MODULE

(71) Applicant: Murata Manufacturing Co., Ltd., Nagaokakyo (JP)

(72) Inventors: Shinji Otani, Nagaokakyo (JP); Akitomo Takahashi, Nagaokakyo (JP); Takaaki Sakai, Nagaokakyo (JP); Takeshi Furukawa, Nagaokakyo (JP); Tatsuya Kitamura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 609 days.

(21) Appl. No.: 17/749,540

(22) Filed: May 20, 2022

(65) Prior Publication Data

US 2022/0278035 A1 Sep. 1, 2022

Related U.S. Application Data

(63) Continuation of application No. PCT/JP2021/018772, filed on May 18, 2021.

(30) Foreign Application Priority Data

May 28, 2020 (JP) .................................. 2020-093536

(51) Int. Cl.
*H01L 23/498* (2006.01)
*H10D 1/20* (2025.01)
*H10D 1/68* (2025.01)

(52) U.S. Cl.
CPC ......... *H01L 23/49827* (2013.01); *H10D 1/20* (2025.01); *H10D 1/692* (2025.01)

(58) Field of Classification Search
CPC ............... H01L 23/49827; H01L 28/60; H01L 2225/06541; H10D 1/692
See application file for complete search history.

(56) References Cited

U.S. PATENT DOCUMENTS

2008/0142961 A1* 6/2008 Jones .................... H01L 25/165
257/E23.085
2008/0277146 A1 11/2008 Hwang et al.
(Continued)

FOREIGN PATENT DOCUMENTS

JP 2008277738 A 11/2008
JP 2012124281 A 6/2012
(Continued)

OTHER PUBLICATIONS

International Search Report in PCT/JP2021/018772, mailed Aug. 3, 2021, 2 pages.

*Primary Examiner* — Shih Tsun A Chou
(74) *Attorney, Agent, or Firm* — ArentFox Schiff LLP

(57) ABSTRACT

A module is used in a semiconductor composite device that supplies a direct-current voltage adjusted by a voltage regulator including a semiconductor active element to a load. The module includes a capacitor layer including at least one capacitor portion forming a capacitor, a connection terminal used for electrical connection with at least one of the voltage regulator and the load, and a through-hole conductor formed to penetrate the capacitor portion in a thickness direction of the capacitor layer. The capacitor is electrically connected to at least one of the load and the voltage regulator with the through-hole conductor interposed between the load and the voltage regulator.

19 Claims, 16 Drawing Sheets

(56) References Cited

U.S. PATENT DOCUMENTS

| | | | |
|---|---|---|---|
| 2009/0288279 A1* | 11/2009 | Dattaguru | H01G 4/38 29/25.41 |
| 2011/0050334 A1 | 3/2011 | Pan et al. | |
| 2012/0138346 A1 | 6/2012 | Uematsu et al. | |
| 2020/0321323 A1 | 10/2020 | Himeda et al. | |
| 2021/0098357 A1* | 4/2021 | Huang | H01L 25/16 |

FOREIGN PATENT DOCUMENTS

| | | |
|---|---|---|
| TW | 201939711 A | 10/2019 |
| WO | 2019130746 A1 | 7/2019 |

\* cited by examiner

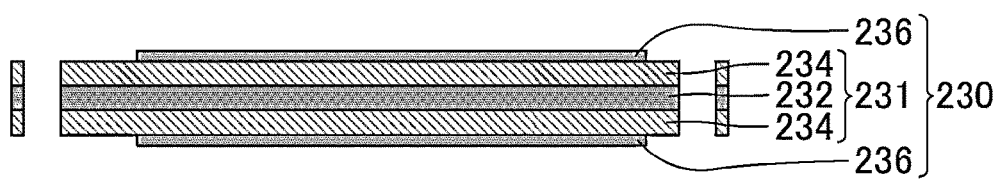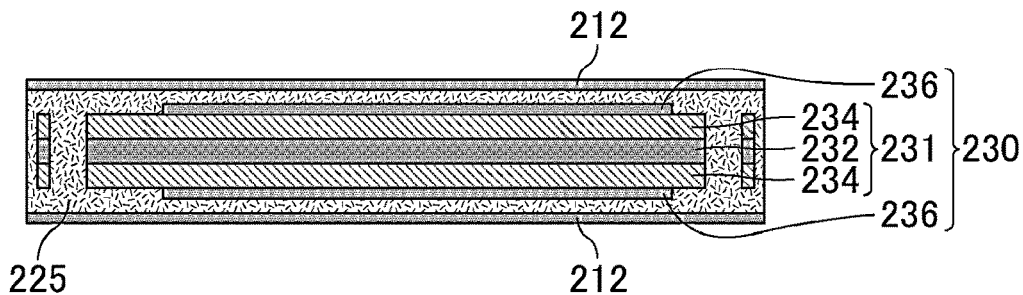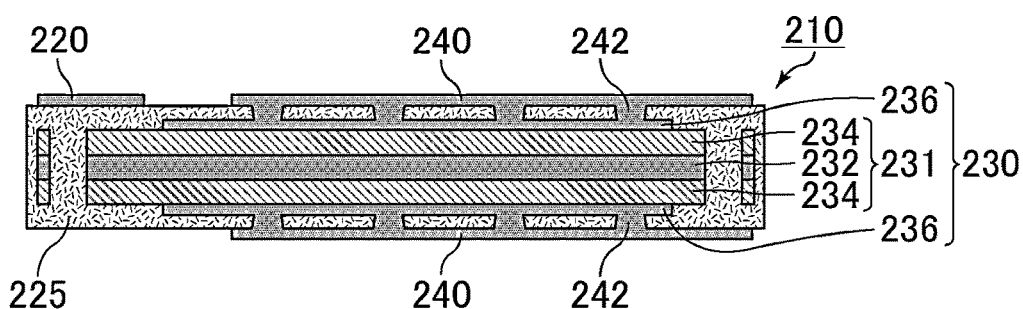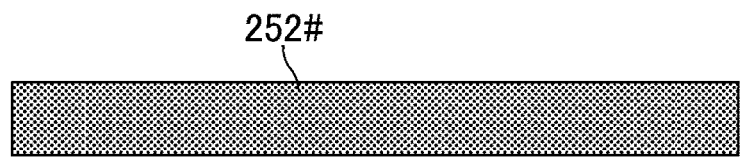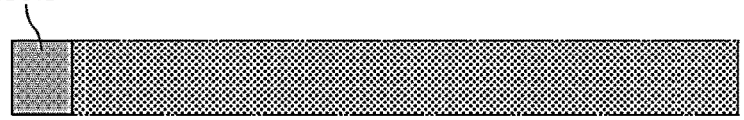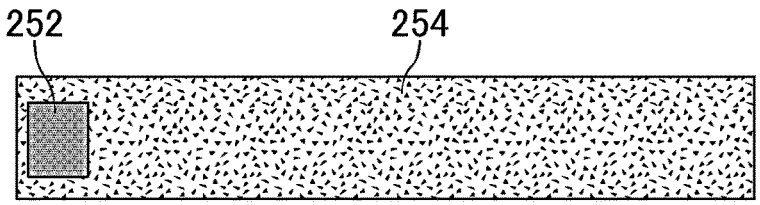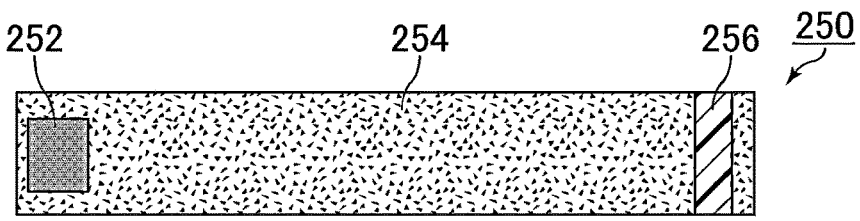

MODULE

CROSS REFERENCE TO RELATED APPLICATIONS

This application is a continuation of PCT Application No. PCT/JP2021/018772, filed May 18, 2021, which claims priority to Japanese Patent Application No. 2020-093536, filed May 28, 2020, the entire contents of each of which are hereby incorporated in their entirety.

TECHNICAL FIELD

The present invention relates to a module that can be used in a semiconductor composite device, for example, a package board used in a semiconductor composite device.

BACKGROUND ART

US 2011/0050334 A (hereinafter "Patent Document 1") discloses a semiconductor device having a package board in which a part or whole of a passive element, such as an inductor or a capacitor, is embedded, and a voltage control device (hereinafter, also referred to as a "voltage regulator") including an active element such as a switching element. In the semiconductor device described in Patent Document 1, the voltage regulator and a load to which a power supply voltage is to be supplied are mounted on the package board. A direct-current voltage adjusted by a voltage adjustment portion is smoothed by the passive element in the package board and supplied to the load.

Japanese Patent Application Laid-Open No. 2004-281750 (hereinafter "Patent Document 2") discloses a solid electrolytic capacitor array including a capacitor element group including a plurality of capacitor elements, one or two or more anode terminals respectively connected to one or two or more anode lead-out lines of the capacitor elements of the capacitor element group and extended, one or two or more cathode terminals connected to a cathode layer of the capacitor element and extended, and an exterior resin layer covering the capacitor elements, in which the anode terminals and the cathode terminals are configured as external terminals.

The semiconductor device having the voltage regulator as described in Patent Document 1 is applied to, for example, electronic equipment such as a mobile phone or a smartphone. In recent years, downsizing and thinning of electronic equipment have been promoted, and accordingly, downsizing of a semiconductor device itself has been desired.

However, in the semiconductor device described in Patent Document 1, when the connection distance between the voltage regulator and the load increases, loss due to wiring increases.

Moreover, when the plurality of capacitors is arrayed using the method as described in Patent Document 2, it is difficult to shorten the connection distance between the voltage regulator and the load, and each capacitor.

SUMMARY OF THE INVENTION

Accordingly, it is an object of the present invention to provide a module configured to reduce loss due to wiring by shortening a connection distance between a voltage regulator and a load.

According to an exemplary embodiment, a module of the present invention is configured to be used in a semiconductor composite device that supplies a direct-current voltage adjusted by a voltage regulator including a semiconductor active element to a load. The module includes a capacitor layer including at least one capacitor portion forming a capacitor, a connection terminal used for electrical connection with at least one of the voltage regulator and the load, and a through-hole conductor formed to penetrate the capacitor portion in a thickness direction of the capacitor layer. The capacitor is electrically connected to at least one of the load and the voltage regulator with the through-hole conductor interposed between the load and the voltage regulator.

According to the exemplary embodiment, the loss due to wiring is reduced by shortening the connection distance between the voltage regulator and the load.

BRIEF DESCRIPTION OF DRAWINGS

FIGS. 11A, 11B, and 11C are diagrams for describing a formation process of the capacitor layer 210 in Step S100.

FIGS. 12A, 12B, 12C, and 12D are diagrams for describing a formation process of the inductor layer 250 in Step S110.

DETAILED DESCRIPTION

Hereinafter, a module of an exemplary embodiment of the present invention will be described.

However, it is noted that the exemplary embodiments of the present invention are not limited to the configuration described below, but can be appropriately changed and applied without changing the gist thereof. It is also noted that combinations of two or more of individual desirable configurations of the present invention described below can be implemented according to exemplary aspects.

According to an exemplary aspect, the module of the present invention can be used in a semiconductor composite device that supplies a direct-current voltage adjusted by a voltage regulator including a semiconductor active element to a load.

Moreover, the module of the exemplary embodiment includes a capacitor layer including at least one capacitor portion forming a capacitor, a connection terminal used for electrical connection with the voltage regulator and the load, and a through-hole conductor formed to penetrate the capacitor portion in a thickness direction of the capacitor layer. In the module of the exemplary embodiment, the capacitor is electrically connected to the load and the voltage regulator with the through-hole conductor interposed between the load and the voltage regulator.

Hereinafter, as one exemplary embodiment of the module, a package board will be described as an example.

In the package board according to the exemplary embodiment, the voltage regulator and the load are electrically connected with the through-hole conductor penetrating the capacitor portion interposed between the load and the voltage regulator. Thus, the connection distance between the voltage regulator and the load can be shortened, and as a result, the loss due to wiring can be reduced.

Further, by reducing an inductor component of the wiring portion by shortening the wiring formed on the package board, the switching speed can be increased, and the semiconductor composite device can be downsized.

In addition, since the interval between the wiring formed on the package board such as a signal line and a voltage-regulated power supply line is widened, noise propagation generated by capacitive coupling between the wirings or the like can be reduced, and stable operation of the system can be secured.

Semiconductor Composite Device

Figure 1:
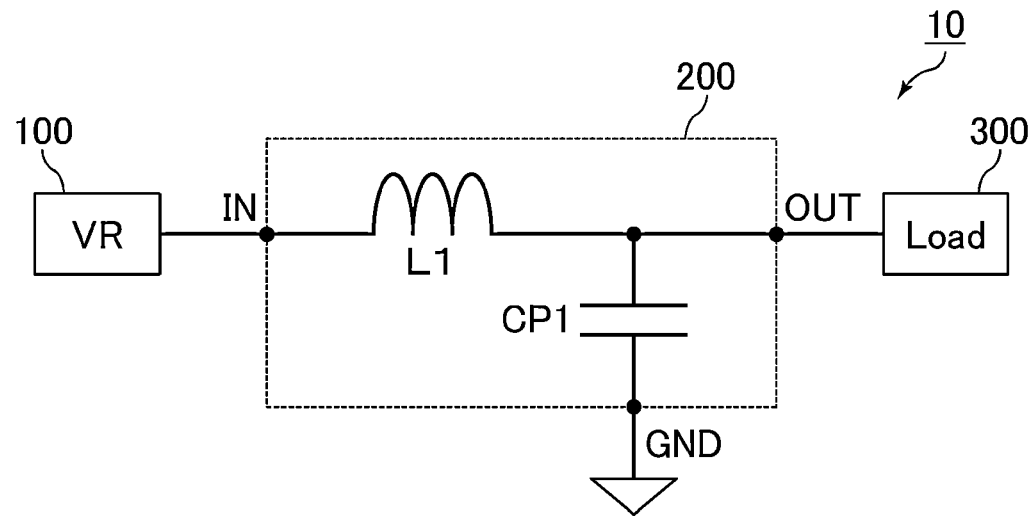
FIG. 1 is a block diagram illustrating a semiconductor composite device according to an exemplary embodiment.

FIG. 1 is a block diagram illustrating a semiconductor composite device according to an exemplary embodiment.

The semiconductor composite device 10 illustrated in FIG. 1 includes a voltage regulator (VR) 100, a package board 200, and a load 300. The load 300 is, for example, a semiconductor integrated circuit (IC), such as a logic operation circuit or a storage circuit.

In this aspect, the voltage regulator 100 includes an active element (not illustrated), such as a semiconductor switching element, and adjusts a direct-current voltage supplied from the outside to a voltage level suitable for the load 300 by controlling the duty of the active element.

The voltage regulator 100 and the load 300 are mounted on the surface of the package board 200, and the semiconductor composite device 10 is configured as one package component. In the semiconductor composite device 10 illustrated in FIG. 1, the inductor L1 and the capacitor CP1 are formed inside the package board 200.

In the semiconductor composite device 10 illustrated in FIG. 1, the inductor L1 is connected between an input terminal IN and an output terminal OUT of the package board 200. The inductor L1 is connected to the voltage regulator 100 at the input terminal IN, and is connected to the load 300 at the output terminal OUT. The capacitor CP1 is connected between the output terminal OUT and a ground terminal GND. The voltage regulator 100, and the inductor L1 and the capacitor CP1 in the package board 200 form a chopper-type step-down switching regulator. The inductor L1 and the capacitor CP1 function as a ripple filter of the step-down switching regulator. For example, a direct-current voltage of 5 V input from the outside is stepped down to 1 V by the switching regulator and supplied to the load 300.

Figure 2:
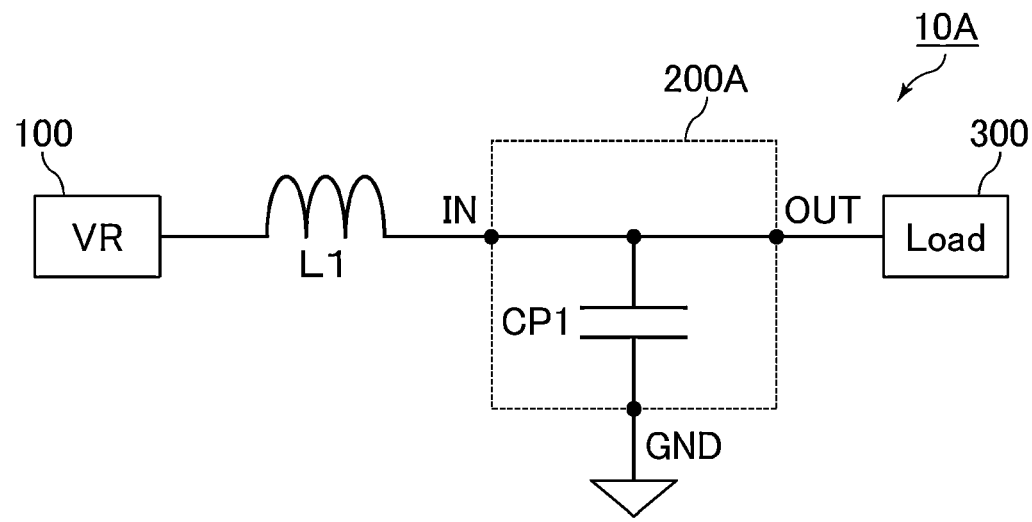
FIG. 2 is a block diagram illustrating a semiconductor composite device according to an exemplary embodiment.

FIG. 2 is a block diagram illustrating another example of a semiconductor composite device according to an exemplary embodiment.

In a semiconductor composite device 10A illustrated in FIG. 2, a capacitor CP1 is formed inside a package board 200A. As illustrated in FIG. 2, an inductor L1 may not be configured as a package component, but instead it may be disposed between a voltage regulator 100 and a package component.

In the semiconductor composite device 10A illustrated in FIG. 2, the inductor L1 is disposed between an input terminal IN of the package board 200A and the voltage regulator 100. The capacitor CP1 is connected between output terminal OUT-input terminal IN and a ground terminal GND. The voltage regulator 100, the inductor L1, and the capacitor CP1 in the package board 200A form a chopper-type step-down switching regulator. In this aspect, the inductor L1 and the capacitor CP1 are configured to function as a ripple filter of the step-down switching regulator. For example, a direct-current voltage of 5 V input from the outside is stepped down to 1 V by the switching regulator and supplied to the load 300.

Note that, in addition to the voltage regulator 100 and the load 300, electronic equipment such as a decoupling capacitor for noise countermeasures, a choke inductor, a surge protection diode element, and a voltage dividing resistance element may be mounted on the package board 200 or 200A.

Hereinafter, a detailed configuration of the semiconductor composite device 10 illustrated in FIG. 1 will be described.

Figure 3:
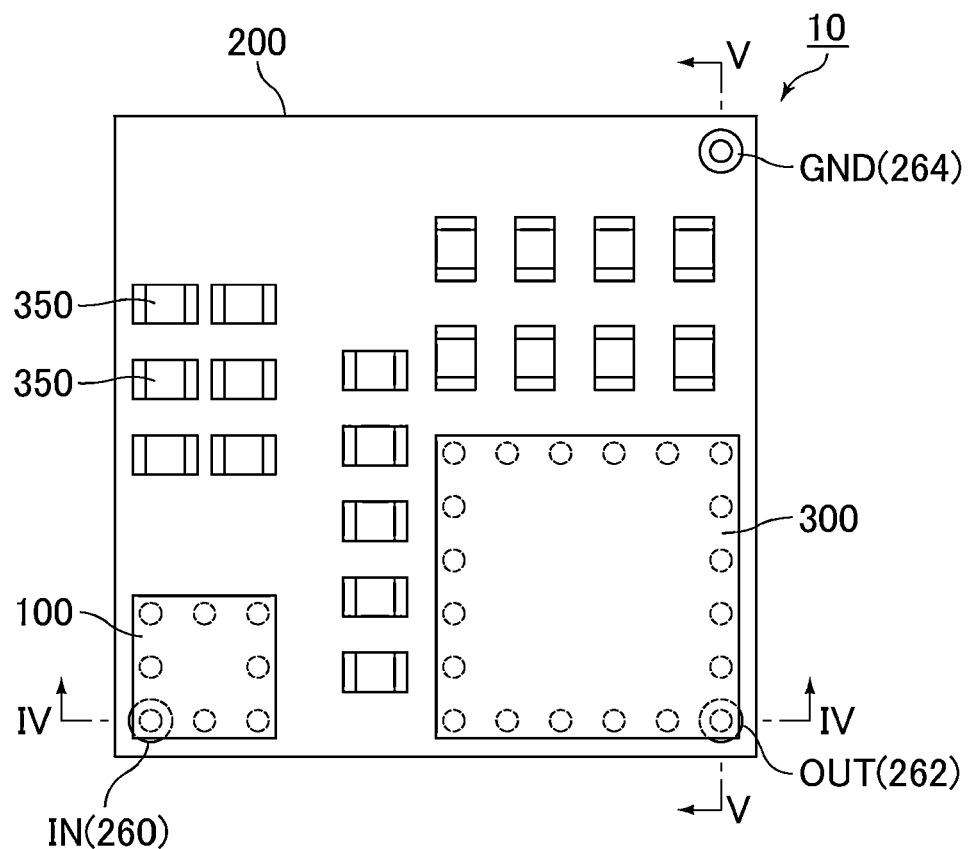
FIG. 3 is a plan view schematically illustrating a semiconductor composite device 10 illustrated in FIG. 1 as viewed from a mounting surface of a package board 200.
Figure 4:
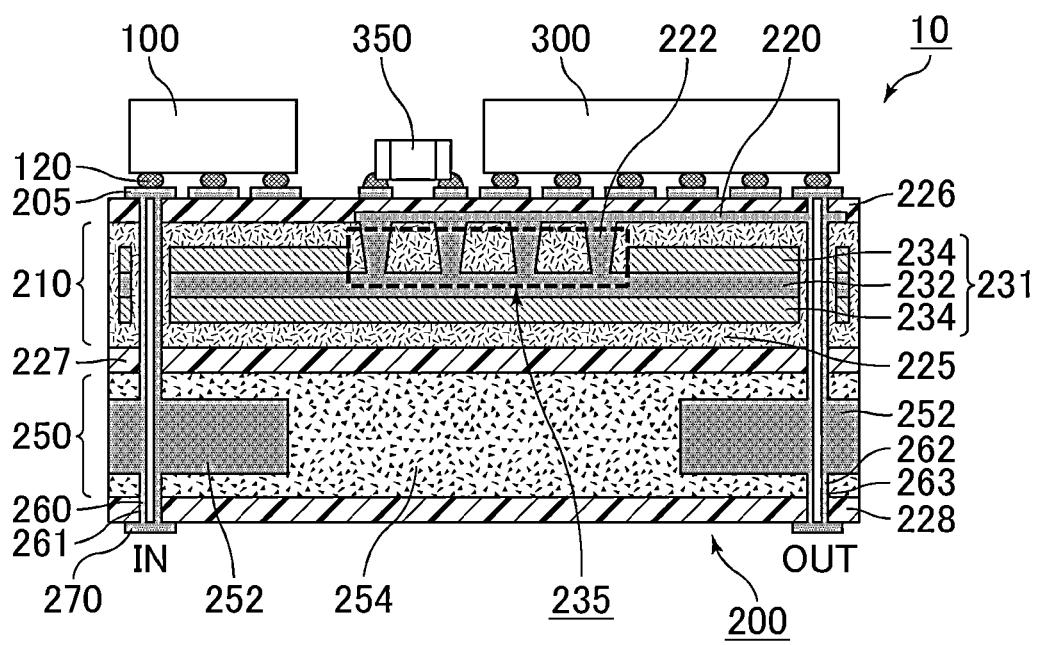
FIG. 4 is a sectional view taken along line IV-IV of the semiconductor composite device 10 illustrated in FIG. 3.
Figure 5:
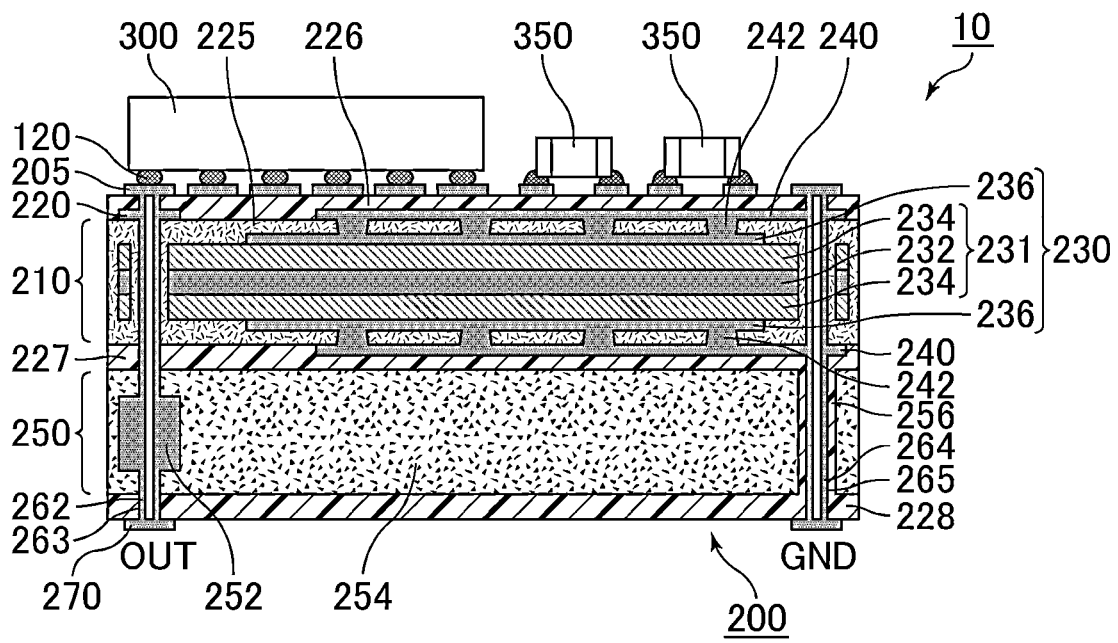
FIG. 5 is a sectional view taken along line V-V of the semiconductor composite device 10 illustrated in FIG. 3.
Figure 6:
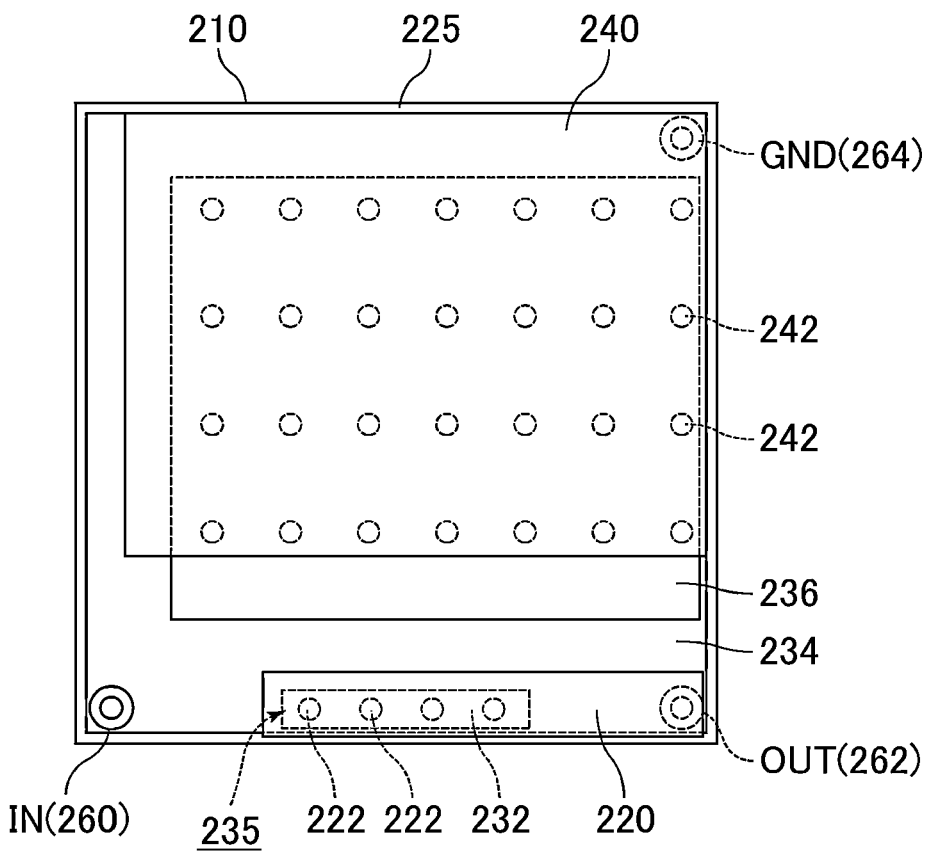
FIG. 6 is a plan view of a portion of a capacitor layer 210 forming a capacitor CP1.
Figure 7:
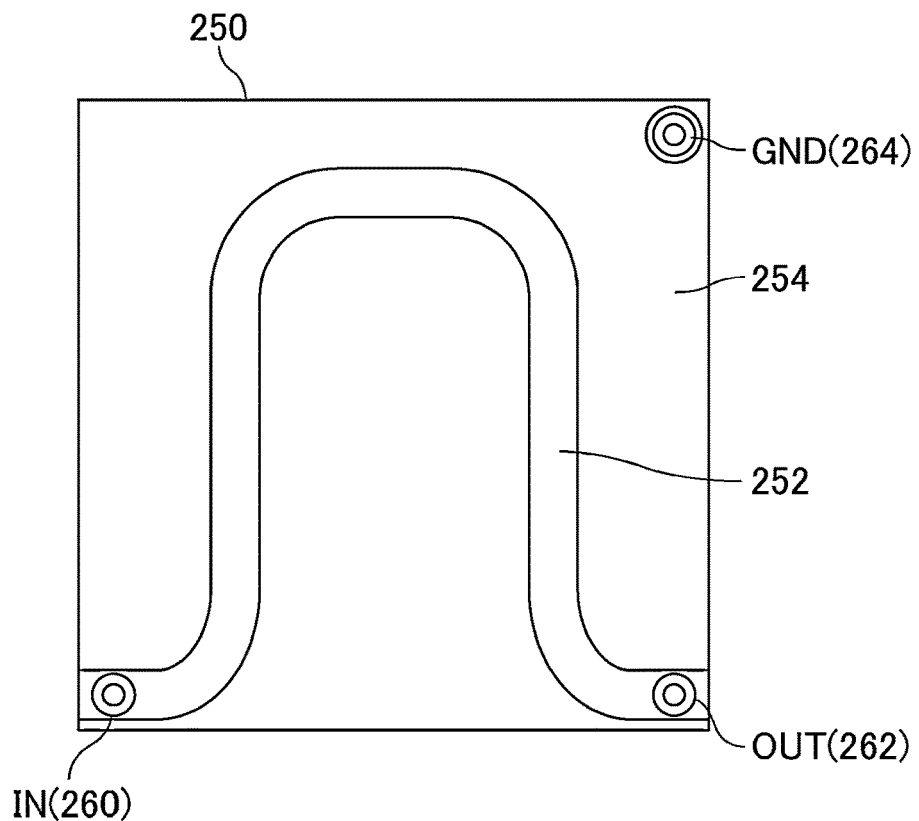
FIG. 7 is a plan view of a portion of an inductor layer 250 forming an inductor L1.

FIG. 3 is a plan view schematically illustrating the semiconductor composite device 10 illustrated in FIG. 1 as viewed from a mounting surface of the package board 200. FIG. 4 is a sectional view taken along line IV-IV of the semiconductor composite device 10 illustrated in FIG. 3. FIG. 5 is a sectional view taken along line V-V of the semiconductor composite device 10 illustrated in FIG. 3. FIG. 6 is a plan view of a portion of the capacitor layer 210 forming the capacitor CP1. FIG. 7 is a plan view of a portion of the inductor layer 250 forming the inductor L1.

As illustrated in FIG. 3, a through-hole conductor 260 corresponding to the input terminal IN, a through-hole conductor 262 corresponding to the output terminal OUT, and a through-hole conductor 264 corresponding to the ground terminal GND are formed at three corners of the mounting surface of the package board 200.

The voltage regulator 100 is disposed at a position overlapping the through-hole conductor 260, and the load 300 is disposed at a position overlapping the through-hole conductor 262. That is, the through-hole conductor 260 is formed at a position immediately below the voltage regulator 100, and the through-hole conductor 262 is formed at a position immediately below the load 300. In addition, as described above, pieces of electronic equipment 350 other than the voltage regulator 100 and the load 300 are mounted on the mounting surface of the package board 200.

As illustrated in FIGS. 4 to 7, the package board 200 includes the capacitor layer 210 forming the capacitor CP1, the inductor layer 250 forming the inductor L1, and resin layers 226, 227, and 228.

According to the exemplary aspect, the resin layers 226, 227, and 228 are used as a bonding material for bonding the layers to each other, and are used as an insulating layer for insulating the exposed surfaces of the capacitor layer 210 and the inductor layer 250. The capacitor layer 210 and the inductor layer 250 are bonded by the resin layer 227. The resin layer 226 is formed on the top surface of the capacitor layer 210, and the resin layer 228 is formed on the bottom surface of the inductor layer 250. The resin layers 226, 227, and 228 include an insulating material, such as a resin (e.g., epoxy, polyimide, or phenol) or a mixed material of a resin, such as epoxy, polyimide, or phenol and an inorganic filler, such as silica or alumina. In order to ensure adhesion with the through-hole conductor, it is preferable to use a material mainly including epoxy as the resin layer.

A circuit layer 205 including lands for mounting the pieces of equipment such as the voltage regulator 100 and wiring for connecting them is formed on the surface of the resin layer 226. The equipment mounted on the package board 200 is electrically connected to the lands or terminals of the circuit layer 205 with solder bumps 120 interposed between the equipment and the lands or terminals of the circuit layer 205.

The circuit layer 205 includes a low-resistance metal material, such as copper (Cu), gold (Au), or silver (Ag), for example. It is noted that the circuit layer 205 is not limited to being formed only on the surface of the resin layer 226, but may be formed, for example, across a plurality of layers inside the resin layer 226. Note that the surfaces of the lands or terminals formed on the mounting surface of the circuit layer 205 are preferably subjected to surface treatment such as nickel/gold (Ni/Au) plating, nickel/lead/gold (Ni/Pb/Au) plating, or preflux treatment in order to facilitate mounting of the equipment. In addition, a solder resist layer may be formed on the outermost layer portion of the circuit layer 205 in order to prevent solder flow at the time of surface mounting of the equipment.

The capacitor layer 210 includes a capacitor portion 230 forming the capacitor CP1, a conductive portion 220 electrically connected to the through-hole conductor 262 of the output terminal OUT, a conductive portion 240 electrically connected to the through-hole conductor 264 of the ground terminal GND, and an insulating portion 225 provided around these.

In the present embodiment, the capacitor portion 230 includes an anode plate 231 including metal. For example, the anode plate 231 has a core portion 232 including a valve-acting metal. The anode plate 231 preferably has a porous portion 234 provided on at least one main surface of the core portion 232. A dielectric layer (not illustrated) is provided on the surface of the porous portion 234, and a cathode layer 236 is provided on the surface of the dielectric layer. Thus, in the present embodiment, the capacitor portion 230 forms an electrolytic capacitor.

When the capacitor portion 230 forms an electrolytic capacitor, the anode plate 231 includes a valve-acting metal exhibiting a so-called valve action. Examples of the valve-acting metal include a single metal such as aluminum, tantalum, niobium, titanium, or zirconium, or an alloy containing at least one type of these metals. Among them, aluminum or an aluminum alloy is preferable.

The shape of the anode plate 231 is preferably a flat plate shape, and more preferably a foil shape. According to the exemplary aspect, it is sufficient if the anode plate 231 has the porous portion 234 on at least one main surface of the core portion 232, and the anode plate 231 may have the porous portion 234 on both main surfaces of the core portion 232. The porous portion 234 is preferably a porous layer formed on the surface of the core portion 232, and more preferably an etching layer.

The dielectric layer provided on the surface of the porous portion 234 is porous reflecting the surface state of the porous portion 234, and has a fine uneven surface shape. The dielectric layer preferably includes an oxide film of the valve-acting metal. For example, when an aluminum foil is used as the anode plate 231, a dielectric layer including an oxide film can be formed by performing anodic oxidation treatment (also referred to as chemical conversion treatment) on the surface of the aluminum foil in an aqueous solution containing ammonium adipate or the like.

The cathode layer 236 provided on the surface of the dielectric layer includes, for example, a solid electrolyte layer provided on the surface of the dielectric layer. The cathode layer 236 preferably further includes a conductor layer provided on the surface of the solid electrolyte layer.

Examples of the material forming the solid electrolyte layer include conductive polymers, such as polypyrroles, polythiophenes, and polyanilines. Among them, polythiophenes are preferable, and poly(3,4-ethylenedioxythiophene) called PEDOT is particularly preferable. In addition, the conductive polymer may contain a dopant such as polystyrene sulfonate (PSS). Note that the solid electrolyte layer preferably includes an inner layer filling pores (recesses) of the dielectric layer and an outer layer covering the dielectric layer.

The conductor layer includes at least one layer of a conductive resin layer and a metal layer. The conductor layer may be only the conductive resin layer or may be only the metal layer. The conductor layer preferably covers the whole surface of the solid electrolyte layer.

Examples of the conductive resin layer include a conductive adhesive layer containing at least one type of conductive filler selected from the group consisting of a silver filler, a copper filler, a nickel filler, and a carbon filler.

Examples of the metal layer include a metal plating film and a metal foil. The metal layer preferably includes at least one type of metal selected from the group consisting of nickel, copper, silver, and alloys containing these metals as main components. For purposes of this disclosure, it is noted that the "main component" refers to an element component having the largest weight ratio of elements.

The conductor layer includes, for example, a carbon layer provided on the surface of the solid electrolyte layer and a copper layer provided on the surface of the carbon layer.

The carbon layer is provided to electrically and mechanically connect the solid electrolyte layer and the copper layer. The carbon layer can be formed in a predetermined region by applying a carbon paste onto the solid electrolyte layer by sponge transfer, screen printing, dispenser, inkjet printing, or the like.

The copper layer can be formed by printing a copper paste onto the carbon layer by sponge transfer, screen printing, spray application, dispenser, inkjet printing, or the like.

The conductive portions 220 and 240 mainly include a low-resistance metal such as Ag, Au, or Cu. For the purpose of improving adhesion force between layers, a conductive adhesive material obtained by mixing the conductive filler and a resin may be provided as the conductive portion.

Moreover, the insulating portion 225 includes an insulating material such as a resin such as epoxy, phenol, or polyimide, or a mixed material of a resin such as epoxy, phenol, or polyimide and an inorganic filler such as silica or alumina.

As illustrated in FIGS. 4 and 6, a part of the porous portion 234 on the equipment mounting surface side is cut out to provide a cutout portion 235 in which the core portion 232 is exposed. In the cutout portion 235, the core portion 232, which is an anode of the capacitor portion 230, is electrically connected to the conductive portion 220 and the through-hole conductor 262 with via conductors 222 interposed between the conductive portion 220 and the through-hole conductor 262. Note that the core portion 232, which is an anode of the capacitor portion 230, may be directly connected to the through-hole conductor 262 on the end surface of the anode plate 231 without the via conductors 222 or the conductive portion 220 interposed between the core portion 232 and the through-hole conductor 262.

In addition, as illustrated in FIGS. 5 and 6, the cathode layer 236, which is a cathode of the capacitor portion 230, is electrically connected to the conductive portion 240 and the through-hole conductor 264 with via conductors 242 interposed between the conductive portion 240 and the through-hole conductor 264.

Note that, as the capacitor portion 230, a ceramic capacitor using barium titanate or a thin film capacitor using silicon nitride (SiN), silicon dioxide ($SiO_2$), hydrogen fluoride (HF), or the like can also be used. However, from the viewpoint of being capable of forming the capacitor portion 230 having a thinner thickness and a relatively large area and mechanical characteristics such as rigidity and flexibility of the package board 200, the capacitor portion 230 is preferably a capacitor using a metal such as aluminum as a substrate, and more preferably an electrolytic capacitor using a metal such as aluminum as a substrate.

The through-hole conductors 260, 262, and 264 are formed so as to penetrate the capacitor portion 230 in the thickness direction of the capacitor layer 210. In the present embodiment, the through-hole conductors 260, 262, and 264 are respectively formed in at least inner wall surfaces of the through-holes 261, 263, and 265 penetrating from the top surface to the bottom surface in the thickness direction of the package board 200. The inner wall surfaces of these through-holes are metallized with a low-resistance metal such as Cu, Au, or Ag. For ease of processing, metallization can be performed by, for example, electroless Cu plating or electrolytic Cu plating. It is noted that the metallization of the through-hole conductor is not limited to the case where only the inner wall surface of the through-hole is metallized, but metal or a composite material of metal and resin may be loaded.

Here, the through-hole conductors are classified into (A) that for an anode of a capacitor, (B) that for a cathode and a ground of a capacitor, and (C) that for an I/O line. In this regard, (A) that for an anode of a capacitor is connected to the anode of the capacitor portion 230, (B) that for a cathode and a ground of a capacitor is connected to the cathode of the capacitor portion 230, and (C) that for an I/O line is not connected to either the anode or the cathode of the capacitor portion 230.

Among the through-hole conductors, (A) that for an anode of a capacitor may or may not be filled with an insulating material between the through-hole penetrating the capacitor portion 230 and the through-hole conductor. The latter case is a structure in which the core portion 232 of the anode plate 231, which is the anode of the capacitor portion 230, is directly connected to the through-hole conductor. (B) that for a cathode and a ground of a capacitor and (C) that for an I/O line are filled with an insulating material between the through-hole penetrating the capacitor portion 230 and the through-hole conductor.

For example, (A) that for an anode of a capacitor corresponds to the through-hole conductor 262, (B) that for a cathode and a ground of a capacitor corresponds to the through-hole conductor 264, and (C) that for an I/O line corresponds to the through-hole conductor 260. In addition, (C) that for an I/O line also correspond, for example, to through-hole conductors 266 and 267 described below.

Figure 8:
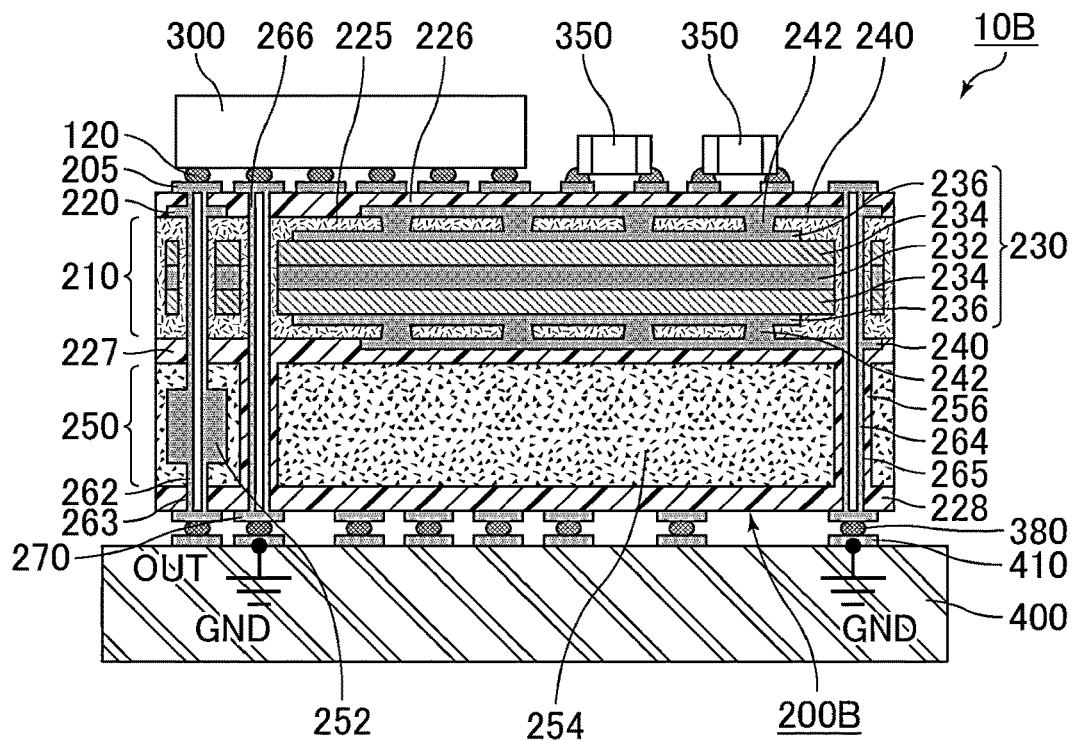
FIG. 8 is a sectional view schematically illustrating a first modification of the semiconductor composite device 10 illustrated in FIG. 1.

FIG. 8 is a sectional view schematically illustrating a first modification of the semiconductor composite device 10 illustrated in FIG. 1. FIG. 8 illustrates a state in which a semiconductor composite device 10B is mounted on a mother board 400.

A package board 200B included in the semiconductor composite device 10B illustrated in FIG. 8 is provided with the through-hole conductor 266 connected to a terminal of a signal ground line of a load 300 when the load 300 is mounted on the board. The through-hole conductor 266 penetrates to a terminal layer 270 on the bottom surface in a state of not being electrically connected to a capacitor portion 230 included in a capacitor layer 210 and a coil portion 252 included in an inductor layer 250. Then, it is electrically connected to a terminal 410 connected to the ground line of the mother board 400 with a solder bump 380 interposed between the through-hole conductor 266 and the terminal 410.

It is noted that although the through-hole conductor of the ground line of the load 300 has been described in FIG. 8, the ground lines of other mounting equipment may have the same configuration.

Figure 9:
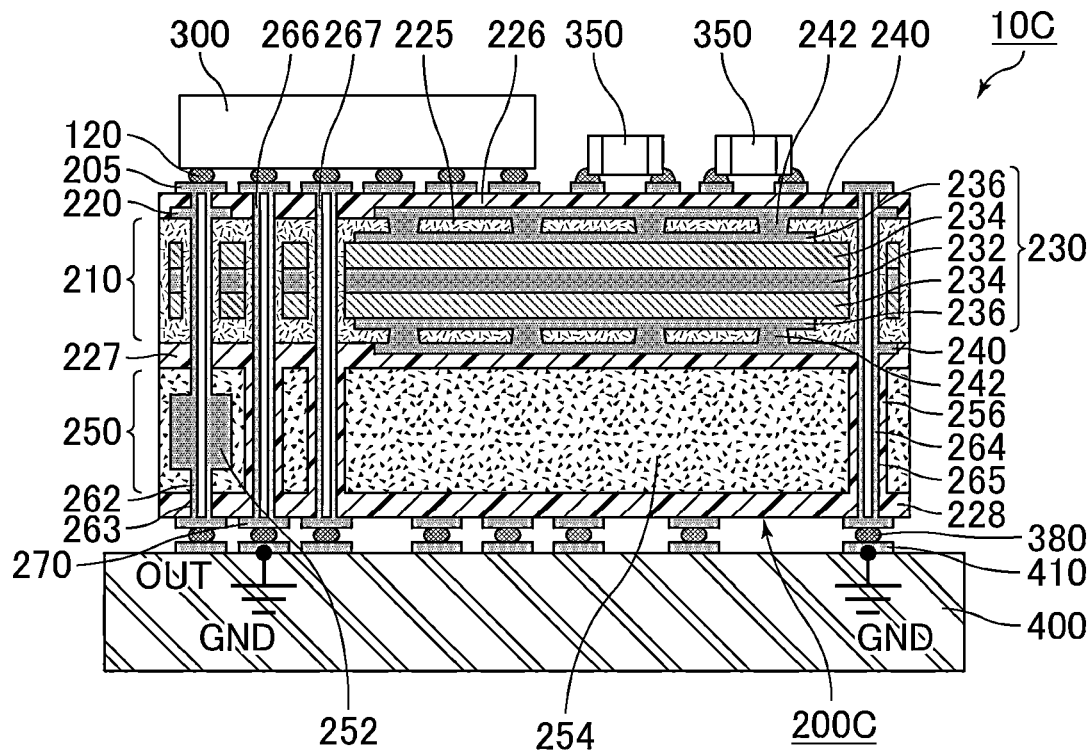
FIG. 9 is a sectional view schematically illustrating a second modification of the semiconductor composite device 10 illustrated in FIG. 1.

FIG. 9 is a sectional view schematically illustrating a second modification of the semiconductor composite device 10 illustrated in FIG. 1. As shown, FIG. 9 illustrates a state in which a semiconductor composite device 10C is mounted on a mother board 400.

A package board 200C included in the semiconductor composite device 10C illustrated in FIG. 9 is provided with the through-hole conductor 267 to a terminal of a signal line of a load 300 or a voltage regulator 100 disposed on the mounting surface. Similarly to the through-hole conductor 266 for a signal ground line illustrated in FIG. 8, the through-hole conductor 267 penetrates to a terminal layer 270 on the bottom surface in a state of not being electrically connected to a capacitor portion 230 included in a capacitor layer 210 and a coil portion 252 included in an inductor layer 250. Then, the through-hole conductor 267 is electrically connected to a signal line for connection to an I/O terminal of equipment (not illustrated) formed on the mounting surface of a mother board 400 with a solder bump 380 and a terminal 410 interposed between the through-hole conductor 267 and the signal line.

It is noted that, although FIG. 9 illustrates the through-hole conductor 266 for a ground line described in FIG. 8 in addition to the through-hole conductor 267 for a signal line, in another exemplary aspect, the through-hole conductor 266 can be absent and only the through-hole conductor 267 for a signal line is provided.

As an example, the thickness of each of the core portion 232 and the porous portion 234 of the anode plate 231 is approximately 50 µm, the thickness of each of the conductive portions 220 and 240 is approximately 15 µm, and the thickness of the whole capacitor layer 210 is approximately 200 µm.

As illustrated in FIG. 7, the inductor layer 250 includes the coil portion 252 forming the inductor L1 and an insulating portion 254 obtained by molding the periphery of the coil portion 252 with a resin.

The coil portion 252 is a metal wiring formed by patterning a Cu core material (Cu foil) formed to have a thickness of about 100 µm by electroforming or rolling into a coil shape with a photoresist or the like and then performing etching. One end of the coil portion 252 is electrically connected to the through-hole conductor 260, and the other end is electrically connected to the through-hole conductor 262.

The insulating portion 254 includes an insulating material such, as a resin (e.g., epoxy, phenol, or polyimide), or a mixed material of a resin, such as epoxy, phenol, or polyimide and an inorganic magnetic filler, such as ferrite or silicon steel. In the case of a circuit for supplying direct-current power to the load 300, it is preferable to use a filler of a metal-based magnetic material such as silicon steel having excellent direct-current superimposition characteristics.

For the inorganic magnetic filler, fillers having different average particle diameters may be dispersively disposed in order to improve magnetic characteristics, or may be disposed so as to have a gradient in dispersion concentration in order to prevent magnetic saturation. In addition, a flat or scaly filler may be used to impart directionality to the magnetic characteristics. When a metal-based material such as silicon steel is used as the inorganic magnetic filler, a surface insulating film may be formed around the filler using an inorganic insulating film, an organic insulating film, or the like in order to enhance insulation properties.

It is noted that inorganic fillers and organic fillers other than the magnetic material may be mixed for the purpose of, for example, reducing a difference in linear expansion coefficient with respect to the coil portion 252 and improving heat dissipation or insulation properties.

The inductance can be adjusted by adjusting the thickness of the insulating portion 254. As an example, the insulating portions 254 above and below the coil portion 252 of 100 µm are each 100 µm, and the whole thickness of the inductor layer 250 is approximately 300 µm.

The terminal layer 270 for mounting the semiconductor composite device 10 on a mother board (not illustrated) is formed on the surface of the resin layer 228 provided on the bottom surface of the inductor layer 250. The terminal layer 270 includes the input terminal IN, the output terminal OUT, and the ground terminal GND described above. In addition, similarly to the circuit layer 205 formed on the capacitor layer 210, the terminal layer 270 may include wiring forming a circuit in addition to a terminal, and may further include a plurality of layers.

The package board 200 is generally required to have a thickness of 2 mm or less from the viewpoint of thinning the system and heat dissipation properties of the load 300. As an example, an upper circuit layer including the resin layer 226 and the circuit layer 205 is 50 µm, the capacitor layer 210 is 200 µm, the resin layer 227 is 20 µm, the inductor layer 250 is 300 µm, a bottom terminal layer including the resin layer 228 and the terminal layer 270 is 50 µm, and the thickness of the whole semiconductor composite device 10 is about 0.6 mm.

Hereinafter, a manufacturing process of the semiconductor composite device 10 illustrated in FIG. 1 will be described.

Figure 10:
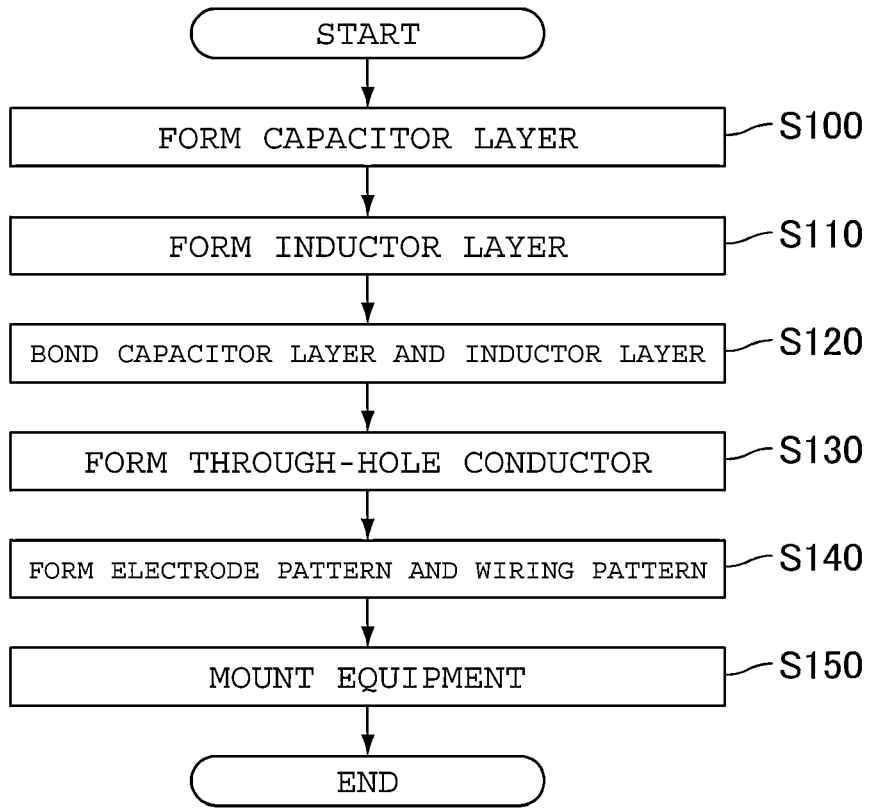
FIG. 10 is a flowchart for describing an outline of a manufacturing process of the semiconductor composite device 10 illustrated in FIG. 1.

FIG. 10 is a flowchart for describing an outline of a manufacturing process of the semiconductor composite device 10 illustrated in FIG. 1.

As illustrated in FIG. 10, the capacitor layer 210 and the inductor layer 250 are individually formed in Steps S100 and S110, respectively. Thereafter, in Step S120, the formed capacitor layer 210 and inductor layer 250 are bonded and integrated using the resin layers 226, 227, and 228. Next, in Step S130, the through-hole conductor is formed in the integrated capacitor layer 210 and inductor layer 250. Thereafter, in Step S140, an electrode pattern and a wiring pattern are formed on the mounting surface, and in Step S150, equipment such as the voltage regulator 100 is mounted on the completed package board 200.

FIGS. 11A, 11B, and 11C are diagrams for describing a formation process of the capacitor layer 210 in Step S100.

As illustrated in FIG. 11A, first, both surfaces of the aluminum foil to be the anode plate 231 are processed into a porous shape to form the porous portions 234 on the surfaces of the core portion 232. Dielectric layers (not illustrated) are formed by applying an oxide film to the surfaces of the porous portions 234. Thereafter, the cathode layers 236 are formed on the surfaces of the dielectric layers.

At this time, as in the capacitor layer 210 in FIG. 4, a part of the porous portion 234 may be cut out until the core portion 232 is exposed by, for example, a dicing process or the like, and a Cu paste may be baked on the exposed core portion 232. Thus, the capacitor portion 230 is formed.

Thereafter, a through-hole is formed in a portion where the through-hole conductor is formed by drilling, laser processing, or the like.

Next, as illustrated in FIG. 11B, a resin such as epoxy, polyimide, or phenol, or a mixed material of a resin such as epoxy, polyimide, or phenol and an inorganic filler such as silica or alumina is laminated on the capacitor portion 230, and further thermally cured to seal the capacitor portion 230, thereby forming the insulating portion 225. After the sealing processing, conductive layers 212 for forming the conductive portions 220 and 240 for connecting the through-hole conductor and the respective electrodes of the capacitor portion 230 are formed on the surfaces of the insulating portion 225 by plating wiring processing or the like. It is noted that the through-hole may be formed after the sealing processing in an alternative exemplary aspect.

Thereafter, as illustrated in FIG. 11C, the conductive layers 212 are processed by etching or the like to form the conductive portions 220 and 240. Then, holes reaching the core portion 232 of the anode plate 231 and the cathode layers 236 are opened in the conductive portions 220 and 240 by laser processing or the like, and are filled with a conductor such as Cu, thereby electrically connecting the core portion 232 of the anode plate 231 and the conductive portion 220 and electrically connecting the cathode layers 236 and the conductive portion 240. Thus, the capacitor layer 210 is formed. It is noted that the core portion 232 of the anode plate 231 can be directly connected to the through-hole conductor 262 on the end surface of the anode plate 231. In this case, it is not necessary to form the conductive portion 220.

FIGS. 12A, 12B, 12C, and 12D are diagrams for describing a formation process of the inductor layer 250 in Step S110.

As illustrated in FIG. 12A, first, patterning is performed on both surfaces of a copper foil 252# to be a core with a photoresist or the like, and a photoresist cavity is etched. Thus, as illustrated in FIG. 12B, the coil portion 252 is formed.

Thereafter, an epoxy composite sheet in which a metal magnetic filler, such as ferrite or silicon steel, is dispersed is laminated on the surface of the coil portion 252 using a vacuum laminator or the like, and flattening and thermosetting treatment of the epoxy layer are performed using a hot press machine. Thus, as illustrated in FIG. 12C, the insulating portion 254 is formed.

Then, as illustrated in FIG. 12D, a through-hole is formed in a portion where the through-hole conductor is formed by drilling, laser processing, or the like, and the through-hole is filled with an insulating resin 256. Thus, the inductor layer 250 is formed.

Figure 13A:
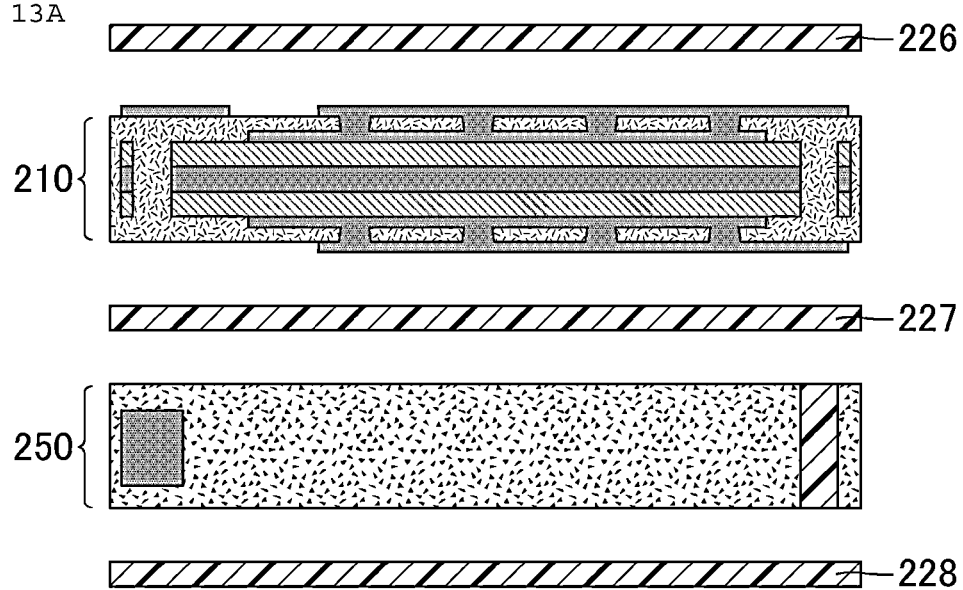
FIGS. 13A and 13B are diagrams for describing a bonding process between the capacitor layer 210 and the inductor layer 250 in Step S120.
Figure 13B:
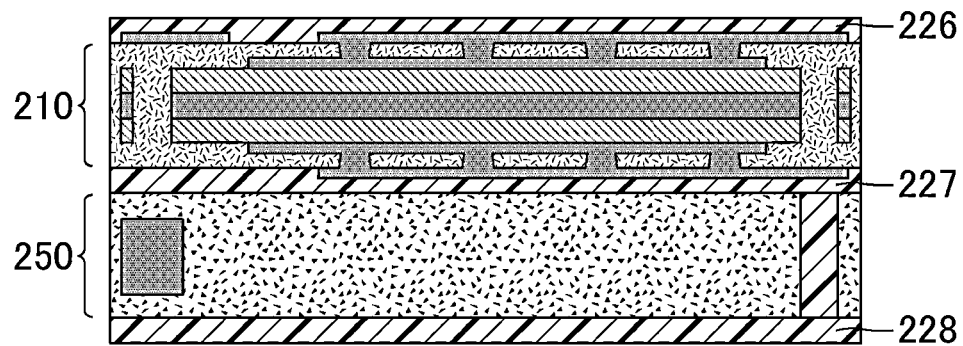

FIGS. 13A and 13B are diagrams for describing a bonding process between the capacitor layer 210 and the inductor layer 250 in Step S120.

As illustrated in FIG. 13A, the resin layers 226, 227, and 228 are obtained such that a resin such as epoxy, polyimide, or phenol, or a mixed material including a resin such as epoxy, polyimide, or phenol and an inorganic filler is formed into a film shape are disposed on the upper and lower surfaces and the intermediate surfaces of the capacitor layer 210 and the inductor layer 250 formed in Steps S100 and S110. Thereafter, as illustrated in FIG. 13B, the stacked layers are integrated by bonding and curing using a vacuum press or the like.

Figure 14A:
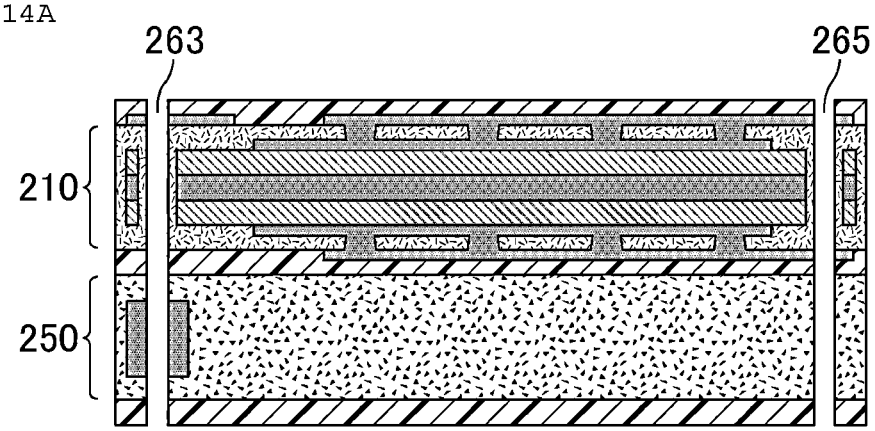
FIGS. 14A and 14B are diagrams for describing a formation process of a through-hole conductor in Step S130.
Figure 14B:
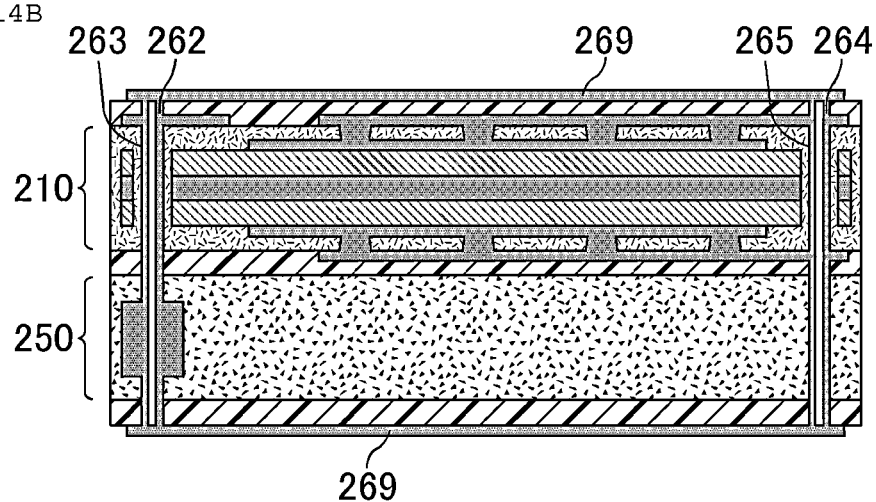

FIGS. 14A and 14B are diagrams for describing a formation process of the through-hole conductor in Step S130.

As illustrated in FIG. 14A, after the layers are integrated, a through-hole is formed in a portion where the through-hole conductor is formed by drilling or laser processing. Then, as illustrated in FIG. 14B, the surface inside the through-hole is metallized by electroless Cu plating or the like to form the through-hole conductor, and the surfaces of the resin layers 226 and 228 are metallized to form metal layers 269.

At this time, electrolytic Cu plating treatment may be further performed to increase the thickness of the metal layers 269 on the surfaces of the resin layers or fill the through-hole in which the through-hole conductor is formed with Cu.

Figure 15:
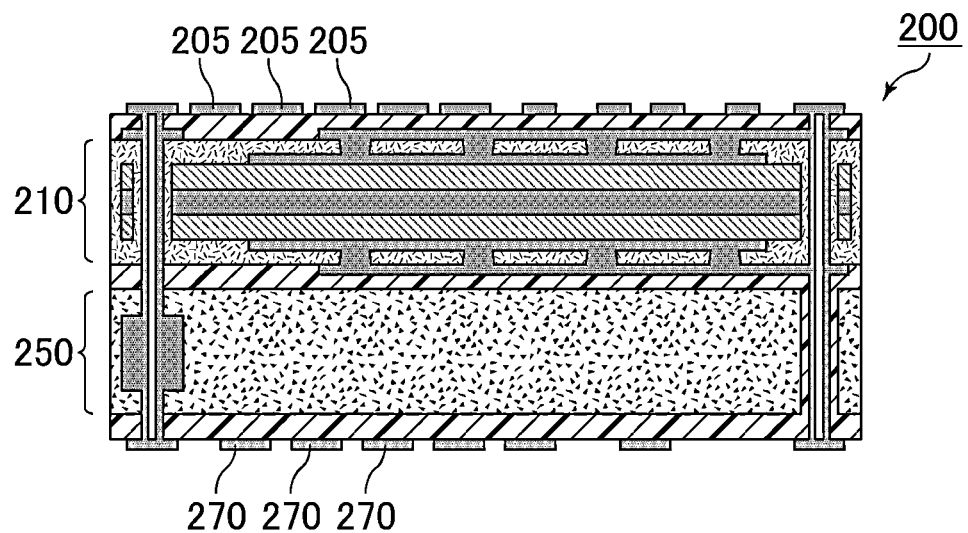
FIG. 15 is a diagram for describing a formation process of an electrode pattern and a wiring pattern in Step S140.

FIG. 15 is a diagram for describing a formation process of an electrode pattern and a wiring pattern in Step S140.

As illustrated in FIG. 15, wiring, lands, and terminals for forming the circuit layer 205 and the terminal layer 270 are formed on the surfaces of the resin layers by patterning the metal layers 269 on the surfaces of the resin layers using a photoresist and removing unnecessary Cu by etching. At this time, in order to facilitate mounting of the equipment, it is preferable that surface treatment such as Ni/Au plating, Ni/Pb/Au plating, or preflux treatment is performed to metal surfaces such as of the lands and the terminals. In addition, a solder resist layer may be formed on the outermost layer portion in order to prevent solder flow at the time of surface mounting of the equipment. Thus, the package board 200 is formed.

Figure 16:
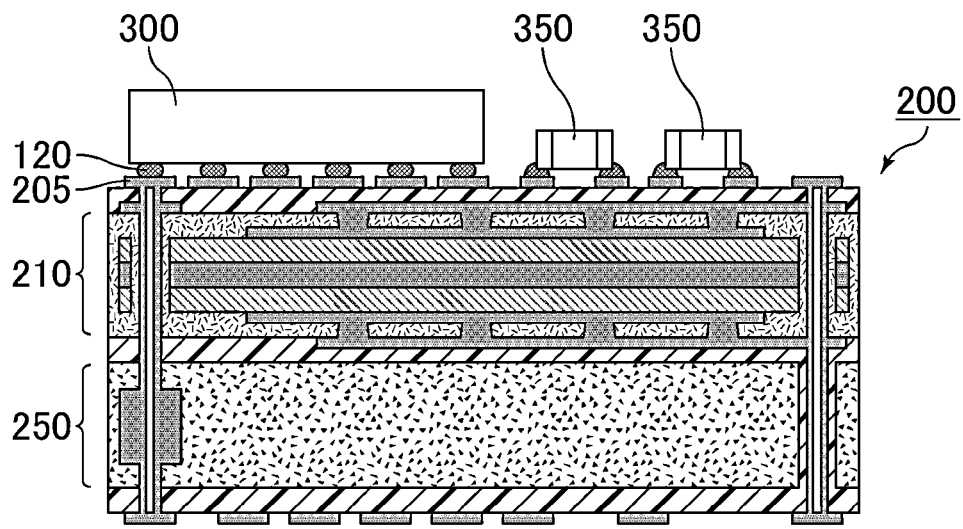
FIG. 16 is a diagram for describing an equipment mounting process in Step S150.

FIG. 16 is a diagram for describing an equipment mounting process in Step S150.

As illustrated in FIG. 16, in the package board 200 formed as described above, the voltage regulator 100 (see FIG. 4), the load 300, and the pieces of other electronic equipment 350 are mounted on the circuit layer 205 on the surface of the capacitor layer 210, and the semiconductor composite device 10 illustrated in FIG. 1 is formed.

It is noted that the semiconductor composite device 10 is configured such that the capacitor layer 210 is disposed above the inductor layer 250 in the package board 200, but the order of the inductor layer 250 and the capacitor layer 210 may be reversed as long as electrical connection is maintained. In addition, the package board may be configured to include therein two or more capacitor layers 210 or may be configured to include two or more inductor layers 250. Alternatively, in the package board, a plurality of capacitor layers may be configured to be disposed in plane or a plurality of inductor layers may be configured to be disposed in plane. Further, like the package board 200A, the inductor layer 250 can be configured not to be disposed in the package board in an alternative aspect.

In addition, in the description, an example of application to a chopper-type step-down switching regulator has been described, but it can also be applied to a semiconductor composite device in which a power transmission line including other step-up/down circuits is systematized.

Package Board

Hereinafter, a package board, which is an exemplary embodiment of the module disclosed herein will be described for each embodiment.

A package board according to an exemplary embodiment of the module includes, for example, a capacitor layer in which a capacitor is formed, a connection terminal used for electrical connection with at least one of a voltage regulator and a load, and a through-hole conductor formed to penetrate the capacitor layer in a thickness direction of the capacitor layer, and the capacitor is electrically connected to at least one of the load and the voltage regulator with the through-hole conductor interposed between the load and the voltage regulator. The package board may or may not include an inductor layer in which an inductor is formed.

Each embodiment described below is an example, and it goes without saying that the configurations illustrated in the different embodiments can be replaced or combined in part as would be appreciated to one skilled in the art. In the second and subsequent embodiments, description of matters common to the first embodiment will be omitted, and only different points will be described. In particular, the same operation and effect of the same configuration will not be sequentially described for each embodiment.

First Exemplary Embodiment

In a package board according to the first exemplary embodiment, a through-hole conductor includes a first through-hole conductor formed in at least an inner wall surface of a first through-hole penetrating a capacitor portion in a thickness direction, and the first through-hole conductor is electrically connected to an anode of the capacitor portion. In the first embodiment, by electrically connecting the first through-hole conductor to the anode of the capacitor portion, the package board can be downsized, and a semiconductor composite device can be further downsized.

Further, in the package board according to the first embodiment, the capacitor portion includes an anode plate including metal, and the first through-hole conductor is connected to an end surface of the anode plate. Thus, it is possible to simultaneously provide the wiring function of connecting the upper and lower sides of the capacitor layer and the function of connecting the anode of the capacitor portion and the wiring through the first through-hole conductor, and thus, the semiconductor composite device can be downsized. Further, as the wiring length is shortened, the ESR of the capacitor can be reduced, and loss due to wiring can be reduced.

Figure 17:
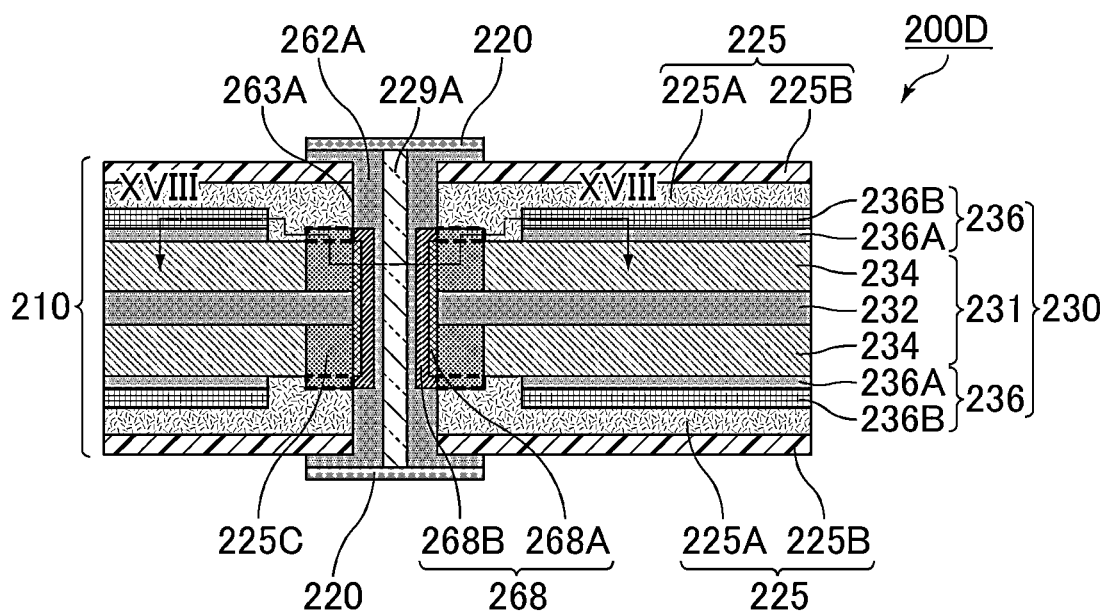
FIG. 17 is a sectional view schematically illustrating a first through-hole conductor and a periphery thereof in an example of a package board according to a first exemplary embodiment.
Figure 18:
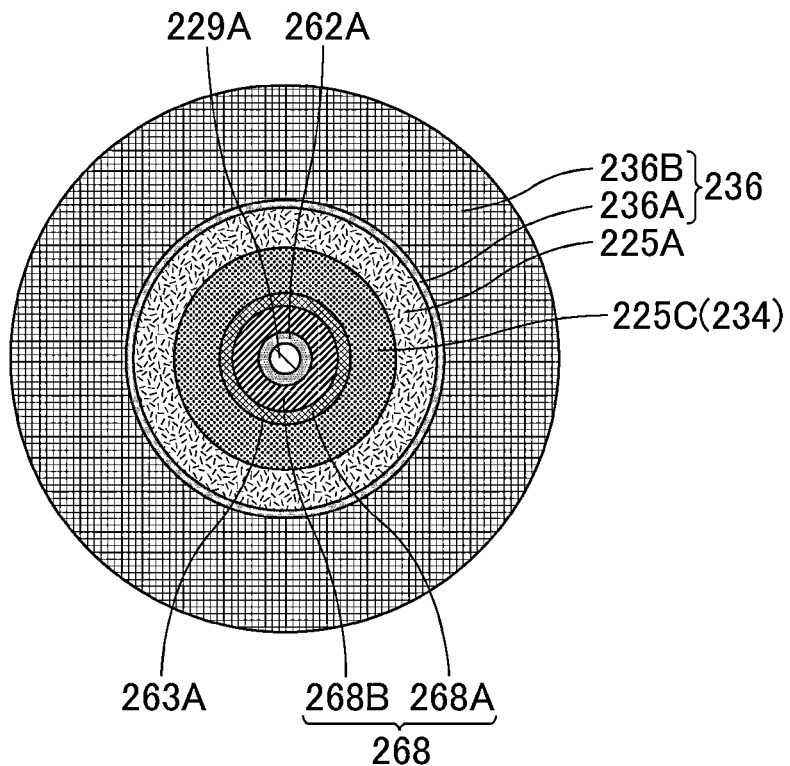
FIG. 18 is a projected sectional view taken along line XVIII-XVIII in FIG. 17.

FIG. 17 is a sectional view schematically illustrating a first through-hole conductor and a periphery thereof in an example of a package board according to the first exemplary embodiment. FIG. 18 is a projected sectional view taken along line XVIII-XVIII in FIG. 17.

A package board 200D illustrated in FIG. 17 includes a capacitor layer 210 and a first through-hole conductor 262A. The capacitor layer 210 includes a capacitor portion 230, conductive portions 220 electrically connected to the first through-hole conductor 262A, and insulating portions 225 stacked on the surfaces of the capacitor portion 230. The conductive portions 220 are formed on the surfaces of the first through-hole conductor 262A and can function as a connection terminal. As illustrated in FIG. 17, the insulating portion 225 preferably includes a first insulating portion 225A stacked on the surface of the capacitor portion 230 and a second insulating portion 225B stacked on the surface of the first insulating portion 225A.

In the present embodiment, the capacitor portion 230 includes an anode plate 231 including metal. The anode plate 231 has a core portion 232 including a valve-acting metal. The anode plate 231 preferably has a porous portion 234 provided on at least one main surface of the core portion 232. Moreover, a dielectric layer (not illustrated) is provided on the surface of the porous portion 234, and a cathode layer 236 is provided on the surface of the dielectric layer. Thus, in the present embodiment, the capacitor portion 230 forms an electrolytic capacitor. It is noted that FIG. 17 illustrates a carbon layer 236A and a copper layer 236B, which are conductor layers, as the cathode layer 236. Although not illustrated in FIG. 17, as the cathode layer 236, a solid electrolyte layer is provided on the surface of the dielectric layer, and a conductor layer is provided on the surface of the solid electrolyte layer.

The first through-hole conductor 262A is formed so as to penetrate the capacitor portion 230 in the thickness direction of the capacitor layer 210. Specifically, the first through-hole conductor 262A is formed in at least an inner wall surface of a first through-hole 263A penetrating the capacitor portion 230 in the thickness direction.

As illustrated in FIGS. 17 and 18, the first through-hole conductor 262A is connected to an end surface of the anode plate 231. That is, the first through-hole conductor 262A is connected to the core portion 232, which is the anode of the capacitor portion 230, on the end surface of the anode plate 231.

The core portion 232 and the porous portions 234 are exposed on the end surface of the anode plate 231 connected to the first through-hole conductor 262A. By filling the porous portions 234 with an insulating material, a third insulating portion 225C is provided around the first through-hole conductor 262A as illustrated in FIGS. 17 and 18.

As illustrated in FIG. 17, the core portion 232 and the porous portions 234 are preferably exposed on the end surface of the anode plate 231 connected to the first through-hole conductor 262A. In this case, since the contact area between the first through-hole conductor 262A and the porous portions 234 is increased, the adhesion is increased, and defects such as peeling of the first through-hole conductor 262A are less likely to occur.

When the core portion 232 and the porous portions 234 are exposed on the end surface of the anode plate 231 connected to the first through-hole conductor 262A, it is also preferable that the insulating material is present in hollow portions of the porous portions 234 according to an exemplary aspect. That is, the third insulating portion 225C is preferably provided around the first through-hole conductor 262A. By filling the porous portions 234 around the first through-hole conductor 262A to some extent with the insulating material, insulation properties between the core portion 232 of the anode plate 231 and the cathode layers 236 can be secured, and a short circuit can be prevented. Further, since it is possible to suppress the dissolution of the end surface of the anode plate 231 generated at the time of chemical solution treatment for forming the conductive portions 220 or the like, the chemical solution can be prevented from entering the capacitor portion 230, and the reliability of the capacitor is improved.

From the viewpoint of enhancing the above-described effect, the thickness of the third insulating portion 225C is preferably thicker than the thickness of the porous portion 234 as illustrated in FIG. 17.

It is noted that when the core portion 232 and the porous portions 234 are exposed on the end surface of the anode plate 231 connected to the first through-hole conductor 262A, the insulating material may not be present in the hollow portions of the porous portions 234. In this case, the hollow portions of the porous portions 234 are exposed on the end surface of the anode plate 231.

As illustrated in FIGS. 17 and 18, an anode connection layer 268 is provided between the first through-hole conductor 262A and the anode plate 231, and the first through-hole conductor 262A is connected to the end surface of the anode plate 231 with the anode connection layer 268 interposed between the first through-hole conductor 262A and the end surface of the anode plate 231. Since the anode connection layer 268 is provided between the first through-hole conductor 262A and the anode plate 231, the anode connection layer 268 functions as a barrier layer with respect to the core portion 232 and the porous portions 234 of the anode plate 231. As a result, since the dissolution of the anode plate 231 generated at the time of chemical solution treatment for forming the conductive portions 220 or the like can be suppressed, the chemical solution can be prevented from entering the capacitor portion 230, and the reliability of the capacitor is improved.

When the anode connection layer 268 is provided between the first through-hole conductor 262A and the anode plate 231, the anode connection layer 268 includes, for example, a first anode connection layer 268A containing Zn as a main material and a second anode connection layer 268B containing Ni or Cu as a main material in order from the anode plate 231 as illustrated in FIGS. 17 and 18. For example, Zn is displaced and deposited by zincate treatment to form the first anode connection layer 268A on the end surface of the anode plate 231, and then the second anode connection layer 268B is formed on the first anode connection layer 268A by electroless Ni plating treatment or electroless Cu plating treatment. It is noted that the first anode connection layer 268A may disappear, and in this case, the anode connection layer 268 may include only the second anode connection layer 268B.

In particular, the anode connection layer 268 preferably includes a layer containing Ni as a main material. By using Ni for the anode connection layer 268, damage to Al or the like forming the anode plate 231 can be reduced, and the barrier properties can be improved.

In a case where the anode connection layer 268 is provided between the first through-hole conductor 262A and the anode plate 231, when viewed in section from a direction orthogonal to the thickness direction as illustrated in FIG. 17, the length of the anode connection layer 268 in the direction in which the first through-hole conductor 262A extends is preferably longer than the length of the anode plate 231 in the direction in which the first through-hole conductor 262A extends. In this case, the core portion 232 and the porous portions 234 exposed on the end surface of the anode plate 231 are fully covered with the anode connection layer 268, so that the above-described dissolution of the anode plate 231 can be further suppressed.

When viewed in section from a direction orthogonal to the thickness direction, for example, the length of the anode connection layer 268 in the direction in which the first through-hole conductor 262A extends is preferably 100% or more and 200% or less of the length of the anode plate 231 in the direction in which the first through-hole conductor 262A extends. The length of the anode connection layer 268 in the direction in which the first through-hole conductor 262A extends may be the same as the length of the anode plate 231 in the direction in which the first through-hole conductor 262A extends, or may be shorter than the length of the anode plate 231 in the direction in which the first through-hole conductor 262A extends.

As illustrated in FIG. 18, when viewed in plan from the thickness direction, the first through-hole conductor 262A is preferably connected to the end surface of the anode plate 231 over the whole circumference of the first through-hole 263A. In this case, since the contact area between the first through-hole conductor 262A and the anode plate 231 increases, the connection resistance with the first through-hole conductor 262A is reduced, and the ESR of the capacitor can be reduced. Further, the adhesion between the first through-hole conductor 262A and the anode plate 231 is increased, and defects such as peeling at the connection surface due to thermal stress are less likely to occur.

The first through-hole 263A is preferably filled with a material containing a resin. That is, as illustrated in FIGS. 17 and 18, it is preferable that a first resin-filled portion 229A is provided in the first through-hole 263A. By filling the first through-hole 263A with a resin material to eliminate a gap, occurrence of delamination of the first through-hole conductor 262A formed in the inner wall surface of the first through-hole 263A can be suppressed.

According to the exemplary aspect, the material filled into the first through-hole 263A preferably has a thermal expansion coefficient larger than that of the material (for example, copper) forming the first through-hole conductor 262A. In this case, the material filled into the first through-hole 263A expands in a high-temperature environment, so that the first through-hole conductor 262A is pressed from an inner side to an outer side of the first through-hole 263A, and the occurrence of delamination of the first through-hole conductor 262A can be further suppressed.

In addition, the thermal expansion coefficient of the material filled into the first through-hole 263A can be the same as the thermal expansion coefficient of the material forming the first through-hole conductor 262A, or can be smaller than the thermal expansion coefficient of the material forming the first through-hole conductor 262A.

In the package board according to the first exemplary embodiment, the through-hole conductor further includes a second through-hole conductor formed in at least an inner wall surface of a second through-hole penetrating the capacitor portion, in which the first through-hole conductor is formed, in the thickness direction, and the second through-hole conductor is preferably electrically connected to a cathode of the capacitor portion. In this case, by electrically connecting the second through-hole conductor to the cathode of the capacitor portion, the package board can be downsized, and the semiconductor composite device can be further downsized.

Figure 19:
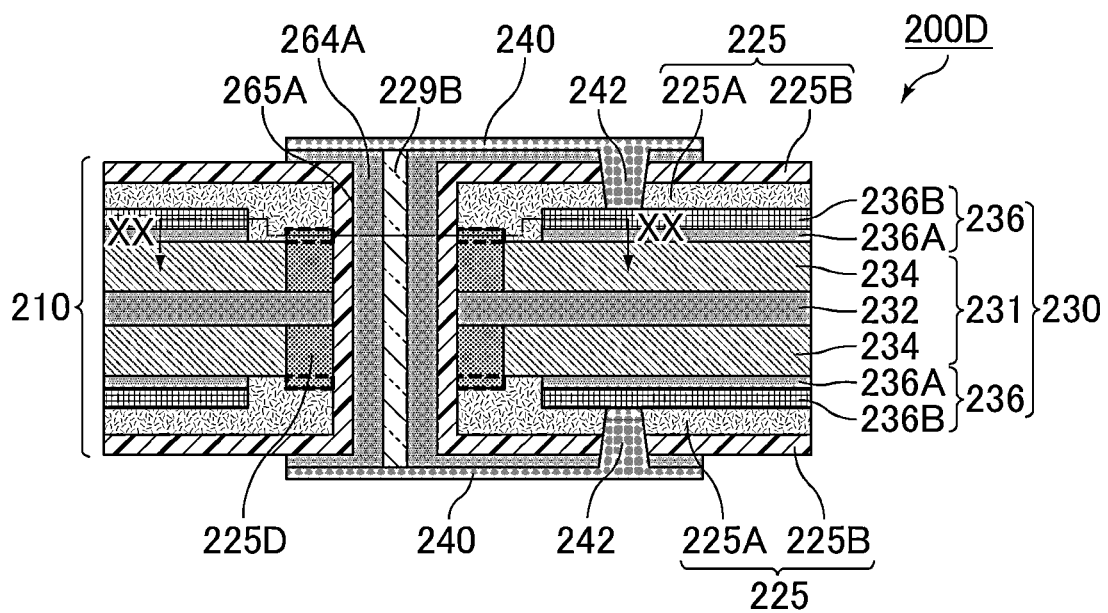
FIG. 19 is a sectional view schematically illustrating a second through-hole conductor and a periphery thereof in the package board illustrated in FIG. 17.
Figure 20:
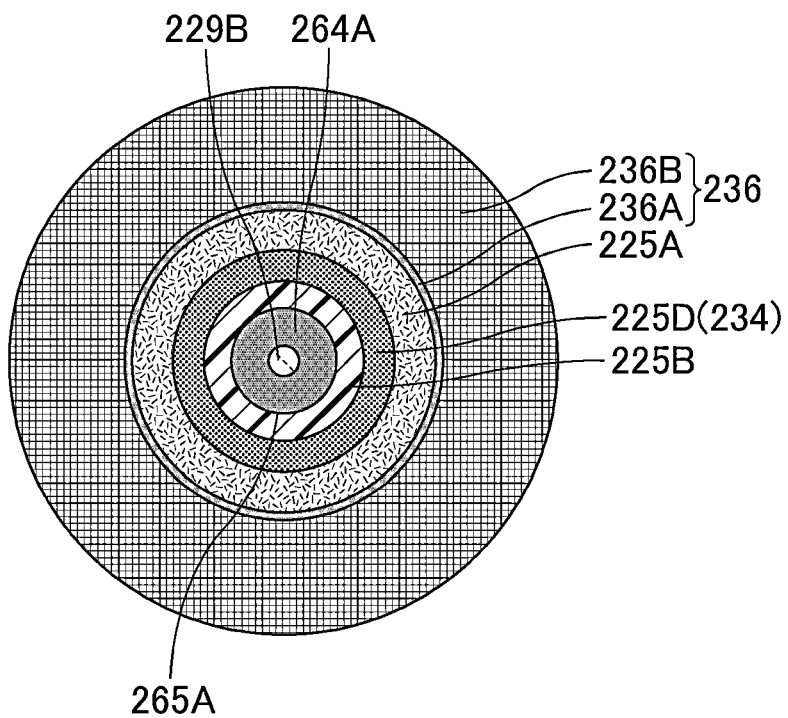
FIG. 20 is a projected sectional view taken along line XX-XX in FIG. 19.

FIG. 19 is a sectional view schematically illustrating a second through-hole conductor and a periphery thereof in the package board illustrated in FIG. 17. FIG. 20 is a projected sectional view taken along line XX-XX in FIG. 19.

A package board 200D illustrated in FIG. 19 includes a capacitor layer 210 and a second through-hole conductor 264A. The capacitor layer 210 includes a capacitor portion 230, conductive portions 240 electrically connected to the second through-hole conductor 264A, and insulating portions 225 stacked on the surfaces of the capacitor portion 230. The conductive portions 240 are formed on the surfaces of the second through-hole conductor 264A and can function as a connection terminal. As illustrated in FIG. 19, the insulating portion 225 preferably includes a first insulating portion 225A stacked on the surface of the capacitor portion 230 and a second insulating portion 225B stacked on the surface of the first insulating portion 225A.

As described with reference to FIG. 17, the capacitor portion 230 includes an anode plate 231 including metal. For example, the anode plate 231 has a core portion 232 including a valve-acting metal. The anode plate 231 preferably has a porous portion 234 provided on at least one main surface of the core portion 232. A dielectric layer (not illustrated) is provided on the surface of the porous portion 234, and a cathode layer 236 is provided on the surface of the dielectric layer. Thus, in the present embodiment, the capacitor portion 230 forms an electrolytic capacitor.

The second through-hole conductor 264A is formed so as to penetrate the capacitor portion 230 in the thickness direction of the capacitor layer 210. Specifically, the second through-hole conductor 264A is formed in at least an inner wall surface of a second through-hole 265A penetrating the capacitor portion 230 in the thickness direction.

As illustrated in FIG. 19, the second through-hole conductor 264A is electrically connected to the cathode layers 236 with the conductive portions 240 and the via conductors 242 interposed between the second through-hole conductor 264A and the cathode layers 236.

When the insulating portion 225 includes the first insulating portion 225A and the second insulating portion 225B, as illustrated in FIGS. 19 and 20, the second insulating portion 225B preferably extends between the second through-hole conductor 264A and the anode plate 231. When the second insulating portion 225B is present between the second through-hole conductor 264A and the anode plate 231, insulation properties between the second through-hole conductor 264A and the core portion 232 of the anode plate 231 can be secured.

As further shown, the core portion 232 and the porous portions 234 are exposed on the end surface of the anode plate 231 contacting the second insulating portion 225B. By filling the porous portions 234 with an insulating material, a fourth insulating portion 225D is provided around the second through-hole conductor 264A as illustrated in FIGS. 19 and 20.

When the second insulating portion 225B extends between the second through-hole conductor 264A and the anode plate 231, as illustrated in FIG. 19, the core portion 232 and the porous portion 234 are preferably exposed on the end surface of the anode plate 231 contacting the second insulating portion 225B. In this case, since the contact area between the second insulating portion 225B and the porous portions 234 is increased, the adhesion is increased, and defects such as peeling are less likely to occur.

When the core portion 232 and the porous portions 234 are exposed on the end surface of the anode plate 231 contacting the second insulating portion 225B, it is preferable that the insulating material is present in hollow portions of the porous portions 234. That is, as illustrated in FIGS. 19 and 20, it is preferable that the fourth insulating portion 225D is provided around the second through-hole conductor 264A. By filling the porous portions 234 around the second through-hole conductor 264A to some extent with the insulating material, insulation properties between the second through-hole conductor 264A and the core portion 232 of the anode plate 231 can be secured, and a short circuit can be prevented.

From the viewpoint of enhancing the above-described effect, the thickness of the fourth insulating portion 225D is preferably thicker than the thickness of the porous portion 234 as illustrated in FIG. 19.

It is noted that when the core portion 232 and the porous portions 234 are exposed on the end surface of the anode plate 231 contacting the second insulating portion 225B, the insulating material may not be present in the hollow portions of the porous portions 234. In this case, the hollow portions of the porous portions 234 are exposed on the end surface of the anode plate 231.

When the second insulating portion 225B extends between the second through-hole conductor 264A and the anode plate 231, the insulating material forming the second insulating portion 225B preferably enters the hollow portions of the porous portions 234. Thus, the mechanical strength of the porous portions 234 can be increased. In addition, it is possible to suppress the occurrence of delamination caused by pores of the porous portions 234.

The insulating material forming the second insulating portion 225B preferably has a thermal expansion coefficient larger than that of the material (for example, copper) forming the second through-hole conductor 264A. In this case, when the insulating material forming the second insulating portion 225B expands in a high-temperature environment, the porous portions 234 and the second through-hole conductor 264A are pressed, and the occurrence of delamination can be further suppressed.

The thermal expansion coefficient of the insulating material forming the second insulating portion 225B may be the same as the thermal expansion coefficient of the material forming the second through-hole conductor 264A, or may be smaller than the thermal expansion coefficient of the material forming the first through-hole conductor 264A.

In addition, the second through-hole 265A is preferably filled with a material containing a resin. That is, as illustrated in FIGS. 19 and 20, it is preferable that a second resin-filled portion 229B is provided in the second through-hole 265A. By filling the second through-hole 265A with a resin material to eliminate a gap, occurrence of delamination of the second through-hole conductor 264A formed in the inner wall surface of the second through-hole 265A can be suppressed.

The material filled into the second through-hole 265A preferably has a thermal expansion coefficient larger than that of the material (for example, copper) forming the second through-hole conductor 264A. In this case, the material filled into the second through-hole 265A expands in a high-temperature environment, so that the second through-hole conductor 264A is pressed from an inner side to an outer side of the second through-hole 265A, and the occurrence of delamination of the second through-hole conductor 264A can be further suppressed.

The thermal expansion coefficient of the material filled into the second through-hole 265A may be the same as the thermal expansion coefficient of the material forming the second through-hole conductor 264A, or may be smaller than the thermal expansion coefficient of the material forming the second through-hole conductor 264A.

In the package board according to the first exemplary embodiment, the through-hole conductor may include a third through-hole conductor that is not connected to either the anode or the cathode of the capacitor portion. In addition to the first through-hole conductor and the second through-hole conductor, a line connected to the ground and the like are connected to the upper and lower sides of the package board similarly via the through-hole conductor, so that the degree of freedom in designing the package board is improved, and the semiconductor composite device can be further downsized. Examples of the third through-hole conductor include the through-hole conductor 260 illustrated in FIG. 4, the through-hole conductor 266 illustrated in FIG. 8, and the through-hole conductor 267 illustrated in FIG. 9.

As described above, the through-hole conductor are classified into (A) that for an anode of a capacitor, (B) that for a cathode and a ground of a capacitor, and (C) that for an I/O line. In particular, (A) that for an anode of a capacitor corresponds to the first through-hole conductor, (B) that for a cathode and a ground of a capacitor corresponds to the second through-hole conductor, and (C) that for an I/O line corresponds to the third through-hole conductor.

Among the first through-hole conductors for an anode of a capacitor, the first through-hole conductor directly connected to the end surface of the anode plate can be formed, for example, by the method described below.

A through-hole 1 is formed in a portion where the first through-hole conductor is formed by drilling, laser processing, or the like.

An inner wall surface of the through-hole 1 is metallized by plating or the like to form the first through-hole conductor.

The second through-hole conductor for a cathode and a ground of a capacitor and © the third through-hole conductor for an I/O line can be formed, for example, by the method described below.

A through-hole 1 is formed in a portion where the second through-hole conductor or the third through-hole conductor is formed by drilling, laser processing, or the like.

The through-hole 1 is filled with a resin.

A through-hole 2 is formed in the resin filled into the through-hole 1 by drilling, laser processing, or the like. At this time, the diameter of the through-hole 2 is made smaller than the diameter of the resin to provide a state where the resin is present between the through-hole 1 and the through-hole 2.

An inner wall surface of the through-hole 2 is metallized by plating or the like to form the second through-hole conductor or the third through-hole conductor.

In the package board according to the first exemplary embodiment, the capacitor layer may include a plurality of capacitor portions disposed in plane. Also in a case where a plurality of capacitor portions is disposed in plane, the same effect as the effect described above can be obtained with respect to wiring connected to each of the capacitor portions.

Figure 21:
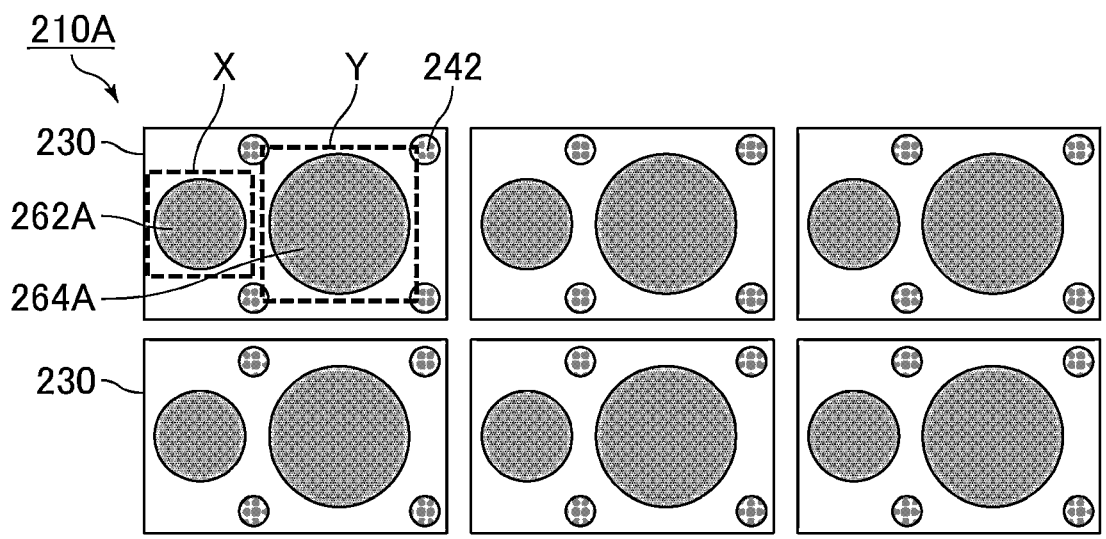
FIG. 21 is a plan view schematically illustrating an example of a capacitor layer on which a plurality of capacitor portions is disposed in plane.

FIG. 21 is a plan view schematically illustrating an example of a capacitor layer on which a plurality of capacitor portions is disposed in plane.

A capacitor layer 210A illustrated in FIG. 21 includes a plurality of capacitor portions 230 disposed in plane. In each capacitor portion 230, an anode X has the structure illustrated in FIGS. 17 and 18, and a cathode Y has the structure illustrated in FIGS. 19 and 20. That is, in the anode X of the capacitor portion 230, the first through-hole conductor 262A is connected to the core portion 232, which is the anode of the capacitor portion 230, on the end surface of the anode plate 231, and the second through-hole conductor 264A is electrically connected to the cathode layers 236 with the conductive portions 240 and the via conductors 242 interposed between the second through-hole conductor 264A and the cathode layers 236.

In the package board according to the first exemplary embodiment, the capacitor layer preferably includes a plurality of capacitor portions in which one capacitor sheet is divided. In this case, since the degree of freedom with respect to the disposition of the capacitor portion is increased, a higher effect can be obtained in downsizing of the semiconductor composite device.

Second Exemplary Embodiment

In the second exemplary embodiment, the shape of a first through-hole conductor is different between a portion located at a core portion and a portion located at a porous portion of an anode plate.

Figure 22:
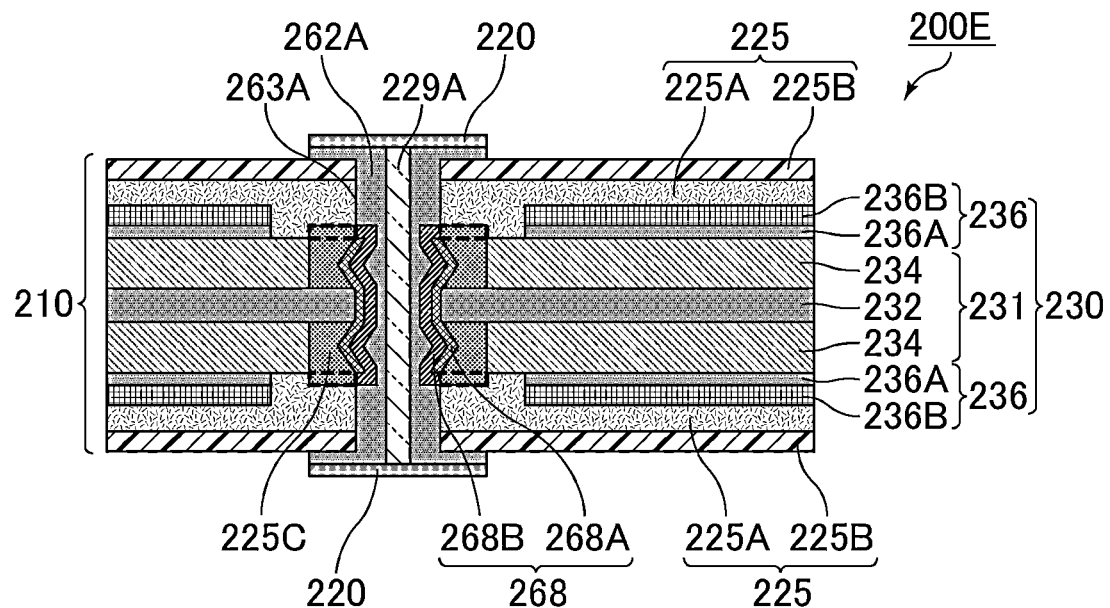
FIG. 22 is a sectional view schematically illustrating a first through-hole conductor and a periphery thereof in an example of a package board according to a second exemplary embodiment.

FIG. 22 is a sectional view schematically illustrating a first through-hole conductor and a periphery thereof in an example of a package board according to the second exemplary embodiment.

In a package board 200E illustrated in FIG. 22, a first through-hole conductor 262A is connected to the end surface of an anode plate 231, and a core portion 232 and porous portions 234 are exposed on the end surface of the anode plate 231 connected to the first through-hole conductor 262A. Further, the outer peripheral length of the first through-hole conductor 262A located at the porous portions 234 is longer than the outer peripheral length of the first through-hole conductor 262A located at the core portion 232.

When the outer peripheral length of the first through-hole conductor 262A located at the porous portions 234 is longer than the outer peripheral length of the first through-hole conductor 262A located at the core portion 232, the contact area between the first through-hole conductor 262A and the porous portions 234 increases, so that adhesion is increased, and peeling or the like of the first through-hole conductor 262A due to thermal stress can be suppressed. Further, the connection resistance with the first through-hole conductor 262A is reduced, and the ESR of the capacitor can be reduced.

It is noted that the shape is not limited to that illustrated in FIG. 22, and it is sufficient if a portion in which the outer peripheral length of the first through-hole conductor 262A located at the porous portions 234 is longer than the outer peripheral length of the first through-hole conductor 262A located at the core portion 232 is present in at least a part of the first through-hole conductor 262A located at the porous portions 234. In addition, the outer peripheral length of the first through-hole conductor 262A located at the core portion 232 may be constant or may not be constant in the thickness direction according to various exemplary aspects. Similarly, the outer peripheral length of the first through-hole conductor 262A located at the porous portions 234 may be constant or may not be constant in the thickness direction.

The maximum outer peripheral length of the first through-hole conductor 262A located at the porous portions 234 is preferably, for example, 100% or more and 150% or less of the maximum outer peripheral length of the first through-hole conductor 262A located at the core portion 232.

Third Exemplary Embodiment

In the third exemplary embodiment, the shape of a first through-hole conductor is different between a portion where an anode connection layer is present and a portion where an anode connection layer is not present.

Figure 23:
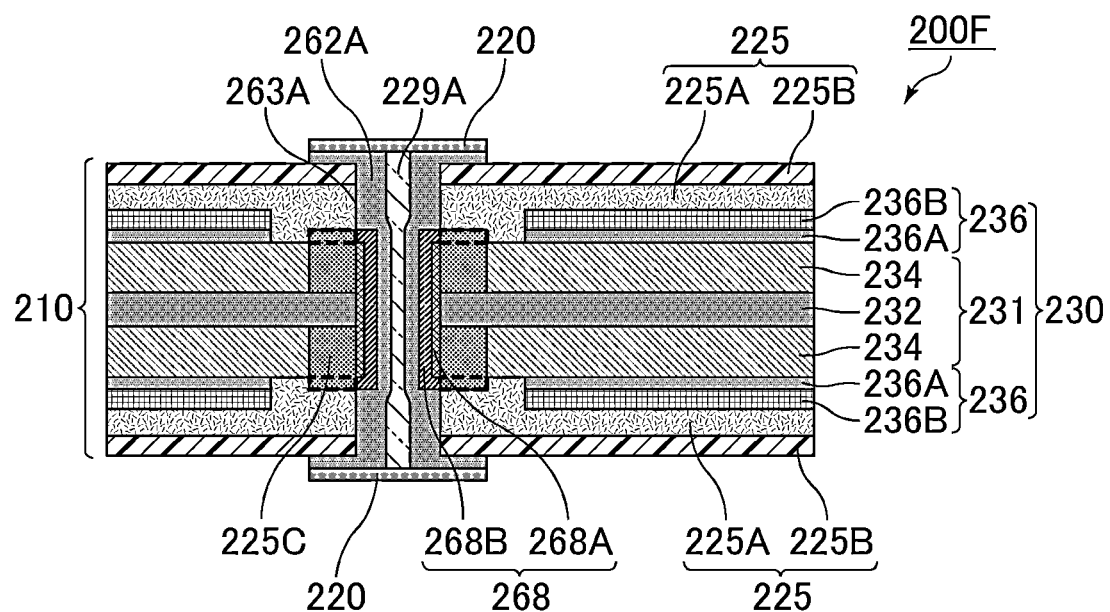
FIG. 23 is a sectional view schematically illustrating a first through-hole conductor and a periphery thereof in an example of a package board according to a third exemplary embodiment.

FIG. 23 is a sectional view schematically illustrating a first through-hole conductor and a periphery thereof in an example of a package board according to the third exemplary embodiment.

As shown, in a package board 200F illustrated in FIG. 23, an anode connection layer 268 is provided between a first through-hole conductor 262A and an anode plate 231, and the first through-hole conductor 262A is connected to the end surface of the anode plate 231 with the anode connection layer 268 interposed between the first through-hole conductor 262A and the end surface of the anode plate 231. As illustrated in FIG. 23, when viewed in section from the direction orthogonal to the thickness direction, the first through-hole conductor 262A of the portion where the anode connection layer 268 is present protrudes inward in a first through-hole 263A as compared with the first through-hole conductor 262A of the portion where the anode connection layer 268 is not present.

Since the first through-hole conductor 262A protrudes inward in the first through-hole 263A in the portion where the anode connection layer 268 is present, the connection resistance between the first through-hole conductor 262A and the anode plate 231 is reduced, and the ESR of the capacitor can be reduced. Further, the adhesion between the first through-hole conductor 262A and the anode connection layer 268 is increased, and peeling or the like of the first through-hole conductor 262A due to thermal stress can be suppressed.

It is noted that the shape is not limited to that illustrated in FIG. 23, and the whole first through-hole conductor 262A of the portion where the anode connection layer 268 is present may protrude inward in the first through-hole 263A, or a part of the first through-hole conductor 262A of the portion where the anode connection layer 268 is present may protrude inward in the first through-hole 263A according to various exemplary aspects. In addition, the amount for which the first through-hole conductor 262A protrudes inward in the first through-hole 263A in the portion where the anode connection layer 268 is present may or may not be constant in the thickness direction.

Fourth Exemplary Embodiment

In the fourth exemplary embodiment, the shape of a first through-hole in which a first through-hole conductor is formed is different between a portion formed in an insulating portion and a portion formed in a capacitor portion.

Figure 24:
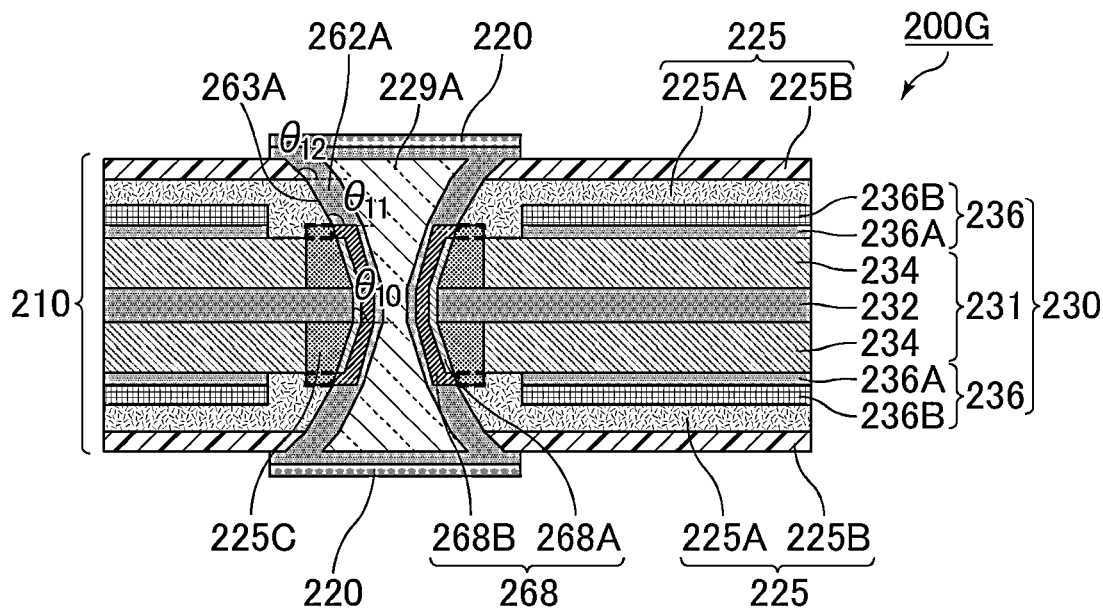
FIG. 24 is a sectional view schematically illustrating a first through-hole conductor and a periphery thereof in an example of a package board according to a fourth exemplary embodiment.

FIG. 24 is a sectional view schematically illustrating a first through-hole conductor and a periphery thereof in an example of a package board according to the fourth exemplary embodiment.

As shown, a package board 200G illustrated in FIG. 24 includes a capacitor layer 210 and a first through-hole conductor 262A. The capacitor layer 210 includes a capacitor portion 230, conductive portions 220, and insulating portions 225. The insulating portion 225 includes a first insulating portion 225A and a second insulating portion 225B.

In the package board 200G illustrated in FIG. 24, an angle (i.e., angle indicated by $\theta_{12}$ in FIG. 24) formed by an inner wall surface of a first through-hole 263A formed in the second insulating portion 225B and an extended surface of the main surface of an anode plate 231 is 90° or more, and is larger than an angle (i.e., angle indicated by $\theta_{10}$ in FIG. 24) formed by an inner wall surface of the first through-hole 263A formed in a core portion 232 of the anode plate 231 and the extended surface of the main surface of the anode plate 231.

Thus, a mechanical stress concentrated on the end of the first through-hole conductor 262A in the first through-hole 263A is dispersed, so that the generation of cracking that may occur in the first through-hole conductor 262A or the like in the first through-hole 263A can be suppressed. Further, since a plating chemical solution used for forming the first through-hole conductor 262A or the like easily enters the first through-hole 263A, the generation of plating defects due to insufficient contact between the plating chemical solution and the first through-hole 263A can be suppressed. In addition, in a case where a first resin-filled portion 229A is provided in the first through-hole 263A, a filling material used for forming the first resin-filled portion 229A easily enters the first through-hole 263A, so that generation of voids in the first resin-filled portion 229A can be suppressed.

From the viewpoint of enhancing the above-described effect, it is preferable that an angle (i.e., angle indicated by $\theta_{11}$ in FIG. 24) formed by the inner wall surface of the first through-hole 263A formed in the first insulating portion 225A and the extended surface of the main surface of the anode plate 231 is 90° or more, and is larger than the angle $\theta_{10}$ formed by the inner wall surface of the first through-hole 263A formed in the core portion 232 of the anode plate 231 and the extended surface of the main surface of the anode plate 231, and the angle $\theta_{12}$ formed by the inner wall surface of the first through-hole 263A formed in the second insulating portion 225B and the extended surface of the main surface of the anode plate 231 is equal to or larger than the angle $\theta_{11}$ formed by the inner wall surface of the first through-hole 263A formed in the first insulating portion 225A and the extended surface of the main surface of the anode plate 231.

The angle $\theta_{12}$ formed by the inner wall surface of the first through-hole 263A formed in the second insulating portion 225B and the extended surface of the main surface of the anode plate 231 is preferably, for example, 100% or more and 500% or less of the angle $\theta_{10}$ formed by the inner wall surface of the first through-hole 263A formed in the core portion 232 of the anode plate 231 and the extended surface of the main surface of the anode plate 231.

The angle $\theta_{11}$ formed by the inner wall surface of the first through-hole 263A formed in the first insulating portion 225A and the extended surface of the main surface of the anode plate 231 is preferably, for example, 100% or more and 500% or less of the angle $\theta_{10}$ formed by the inner wall surface of the first through-hole 263A formed in the core portion 232 of the anode plate 231 and the extended surface of the main surface of the anode plate 231. The angle $\theta_{11}$ formed by the inner wall surface of the first through-hole 263A formed in the first insulating portion 225A and the extended surface of the main surface of the anode plate 231 may be equal to the angle $\theta_{10}$ formed by the inner wall surface of the first through-hole 263A formed in the core portion 232 of the anode plate 231 and the extended surface of the main surface of the anode plate 231, and may be smaller than the angle $\theta_{10}$ formed by the inner wall surface of the first through-hole 263A formed in the core portion 232 of the anode plate 231 and the extended surface of the main surface of the anode plate 231.

The angle $\theta_{12}$ formed by the inner wall surface of the first through-hole 263A formed in the second insulating portion 225B and the extended surface of the main surface of the anode plate 231 is preferably, for example, 100% or more and 500% or less of the angle $\theta_{11}$ formed by the inner wall surface of the first through-hole 263A formed in the first insulating portion 225A and the extended surface of the main surface of the anode plate 231. The angle $\theta_{12}$ formed by the inner wall surface of the first through-hole 263A formed in the second insulating portion 225B and the extended surface of the main surface of the anode plate 231 may be smaller than the angle $\theta_{11}$ formed by the inner wall surface of the first through-hole 263A formed in the first insulating portion 225A and the extended surface of the main surface of the anode plate 231.

The angle $\theta_{10}$ formed by the inner wall surface of the first through-hole 263A formed in the core portion 232 of the anode plate 231 and the extended surface of the main surface of the anode plate 231 is, for example, in a range of 30° or more and 150° or less.

The angle formed by the inner wall surface of the first through-hole 263A formed in a porous portion 234 of the anode plate 231 and an extended surface of the main surface of the anode plate 231 is preferably equal to or more than the angle $\theta_{10}$ formed by the inner wall surface of the first through-hole 263A formed in the core portion 232 of the anode plate 231 and the extended surface of the main surface of the anode plate 231, and smaller than the angle $\theta_{11}$ formed by the inner wall surface of the first through-hole 263A formed in the first insulating portion 225A and the extended surface of the main surface of the anode plate 231.

The angle $\theta_{11}$ formed by the inner wall surface of the first through-hole 263A formed in the first insulating portion 225A and the extended surface of the main surface of the anode plate 231 is, for example, in a range of 30° or more and 150° or less.

The angle $\theta_{12}$ formed by the inner wall surface of the first through-hole 263A formed in the second insulating portion 225B and the extended surface of the main surface of the anode plate 231 is, for example, in a range of 30° or more and 150° or less.

Fifth Exemplary Embodiment

In the fifth exemplary embodiment, the shape of a second through-hole in which a second through-hole conductor is formed is different between a portion formed in an insulating portion and a portion formed in a capacitor portion.

Figure 25:
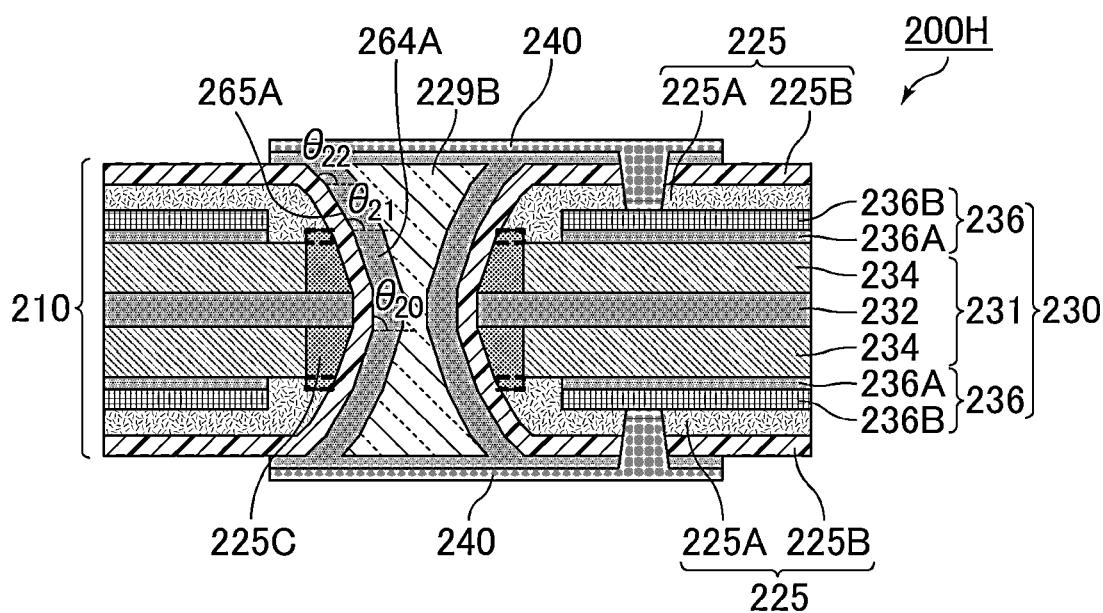
FIG. 25 is a sectional view schematically illustrating a second through-hole conductor and a periphery thereof in an example of a package board according to a fifth exemplary embodiment.

FIG. 25 is a sectional view schematically illustrating a second through-hole conductor and a periphery thereof in an example of a package board according to the fifth exemplary embodiment.

A package board 200H illustrated in FIG. 25 includes a capacitor layer 210 and a second through-hole conductor 264A. The capacitor layer 210 includes a capacitor portion 230, conductive portions 240, and insulating portions 225. The insulating portion 225 includes a first insulating portion 225A and a second insulating portion 225B.

In the package board 200H illustrated in FIG. 25, an angle (angle indicated by $\theta_{22}$ in FIG. 25) formed by an inner wall surface of a second through-hole 265A formed in the second insulating portion 225B and an extended surface of the main surface of an anode plate 231 is 90° or more, and is larger than an angle (angle indicated by $\theta_{20}$ in FIG. 25) formed by the inner wall surface of the second through-hole 265A formed in the second insulating portion 225B contacting a core portion 232 of the anode plate 231 and the extended surface of the main surface of the anode plate 231.

Thus, a mechanical stress concentrated on the end of the second through-hole conductor 264A in the second through-hole 265A is dispersed, so that it is possible to suppress the generation of cracking that may occur in the second through-hole conductor 264A or the like in the second through-hole 265A. Further, since a plating chemical solution used for forming the second through-hole conductor 264A easily enters the second through-hole 265A, it is possible to suppress the generation of plating defects due to insufficient contact between the plating chemical solution and the second through-hole 265A. In addition, in a case where a second resin-filled portion 229B is provided in the second through-hole 265A, a filling material used for forming the second resin-filled portion 229B easily enters the second through-hole 265A, so that generation of voids in the second resin-filled portion 229B can be suppressed.

From the viewpoint of enhancing the above-described effect, it is preferable that an angle (angle indicated by $\theta_{21}$ in FIG. 25) formed by the inner wall surface of the second through-hole 265A formed in the first insulating portion 225A and the extended surface of the main surface of the anode plate 231 is 90° or more, and is larger than the angle $\theta_{20}$ formed by the inner wall surface of the second through-hole 265A formed in the second insulating portion 225B contacting the core portion 232 of the anode plate 231 and the extended surface of the main surface of the anode plate 231, and the angle $\theta_{22}$ formed by the inner wall surface of the second through-hole 265A formed in the second insulating portion 225B and the extended surface of the main surface of the anode plate 231 is equal to or larger than the angle $\theta_{21}$ formed by the inner wall surface of the second through-hole 265A formed in the first insulating portion 225A and the extended surface of the main surface of the anode plate 231.

The angle $\theta_{22}$ formed by the inner wall surface of the second through-hole 265A formed in the second insulating portion 225B and the extended surface of the main surface of the anode plate 231 is preferably, for example, 100% or more and 500% or less of the angle $\theta_{20}$ formed by the inner wall surface of the second through-hole 265A formed in the second insulating portion 225B contacting the core portion 232 of the anode plate 231 and the extended surface of the main surface of the anode plate 231.

Moreover, the angle $\theta_{21}$ formed by the inner wall surface of the second through-hole 265A formed in the first insulating portion 225A and the extended surface of the main surface of the anode plate 231 is preferably, for example, 100% or more and 500% or less of the angle $\theta_{20}$ formed by the inner wall surface of the second through-hole 265A formed in the second insulating portion 225B contacting the core portion 232 of the anode plate 231 and the extended surface of the main surface of the anode plate 231. The angle $\theta_{21}$ formed by the inner wall surface of the second through-hole 265A formed in the first insulating portion 225A and the extended surface of the main surface of the anode plate 231 may be equal to the angle $\theta_{20}$ formed by the inner wall surface of the second through-hole 265A formed in the second insulating portion 225B contacting the core portion 232 of the anode plate 231 and the extended surface of the main surface of the anode plate 231, and may be smaller than the angle $\theta_{20}$ formed by the inner wall surface of the second through-hole 265A formed in the second insulating portion 225B contacting the core portion 232 of the anode plate 231 and the extended surface of the main surface of the anode plate 231.

According to an exemplary aspect, the angle $\theta_{20}$ formed by the inner wall surface of the second through-hole 265A formed in the second insulating portion 225B contacting the core portion 232 of the anode plate 231 and the extended surface of the main surface of the anode plate 231 is, for example, in a range of 30° or more and 150° or less.

Moreover, the angle formed by the inner wall surface of the second through-hole 265A formed in the second insulating portion 225B contacting a porous portion 234 of the anode plate 231 and an extended surface of the main surface of the anode plate 231 is preferably equal to or more than the angle $\theta_{20}$ formed by the inner wall surface of the second through-hole 265A formed in the second insulating portion 225B contacting the core portion 232 of the anode plate 231 and the extended surface of the main surface of the anode plate 231, and smaller than the angle $\theta_{21}$ formed by the inner wall surface of the second through-hole 265A formed in the first insulating portion 225A and the extended surface of the main surface of the anode plate 231.

In an exemplary aspect, the angle $\theta_{21}$ formed by the inner wall surface of the second through-hole 265A formed in the first insulating portion 225A and the extended surface of the main surface of the anode plate 231 is, for example, in a range of 30° or more and 150° or less.

In an exemplary aspect, the angle $\theta_{22}$ formed by the inner wall surface of the second through-hole 265A formed in the second insulating portion 225B and the extended surface of the main surface of the anode plate 231 is, for example, in a range of 30° or more and 150° or less.

The angle $\theta_{22}$ formed by the inner wall surface of the second through-hole 265A formed in the second insulating portion 225B and the extended surface of the main surface of the anode plate 231 is preferably, for example, 100% or more and 500% or less of the angle $\theta_{21}$ formed by the inner wall surface of the second through-hole 265A formed in the first insulating portion 225A and the extended surface of the main surface of the anode plate 231. The angle $\theta_{22}$ formed by the inner wall surface of the second through-hole 265A formed in the second insulating portion 225B and the extended surface of the main surface of the anode plate 231 may be smaller than the angle $\theta_{21}$ formed by the inner wall surface of the second through-hole 265A formed in the first insulating portion 225A and the extended surface of the main surface of the anode plate 231.

Additional Exemplary Embodiments

The package board, which is an exemplary embodiment of the module described herein, is not limited to the embodiments, but various applications and modifications can be made within the scope of the present invention with respect to the configuration, manufacturing conditions, and the like of the package board.

For example, when the first through-hole conductor 262A is connected to the end surface of the anode plate 231, the porous portions 234 may not be exposed on the end surface of the anode plate 231 connected to the first through-hole conductor 262A. For example, part of the porous portion 234 may be cut out at the end surface of the anode plate 231 connected to the first through-hole conductor 262A so that the core portion 232 is in an exposed state. In this case, it is preferable that the insulating material is present in the portion where the porous portion 234 is cut out.

Also when the porous portions 234 are not exposed on the end surface of the anode plate 231 connected to the first through-hole conductor 262A, it is preferable that the anode connection layer 268 is provided between the first through-hole conductor 262A and the anode plate 231, and the first through-hole conductor 262A is connected to the end surface of the anode plate 231 with the anode connection layer 268 interposed between the first through-hole conductor 262A and the end surface of the anode plate 231. In addition, when viewed in section from a direction orthogonal to the thickness direction, the length of the anode connection layer 268 in the direction in which the first through-hole conductor 262A extends is preferably longer than the length of the anode plate 231 in the direction in which the first through-hole conductor 262A extends.

Although the package board has been described as one exemplary embodiment of the module, the module of the present invention is not limited to the package board. For example, a module including a capacitor layer, a connection terminal, and a through-hole conductor may be in a form of being mounted on a mother board in a state of being connected to a voltage regulator or a load with the through-hole conductor interposed between the voltage regulator and the load. Exemplary embodiments including a capacitor layer 512 are described as follows with respect to FIGS. 26-30.

Figure 26:
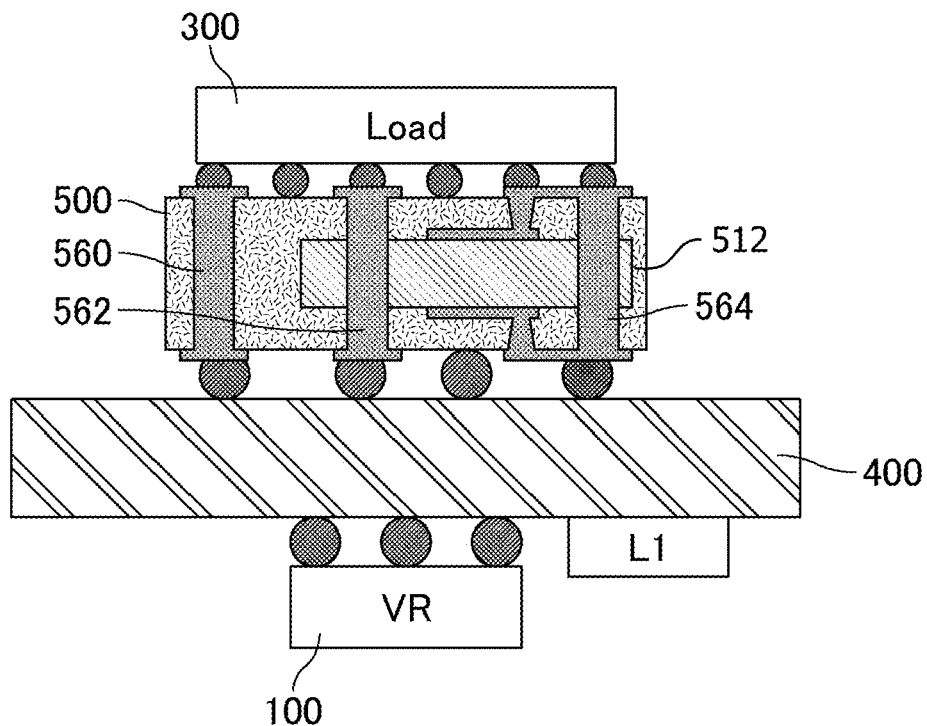
FIG. 26 is a sectional view schematically illustrating an example of a module according to an exemplary embodiment.

FIG. 26 is a sectional view schematically illustrating an example of a module of another exemplary embodiment. As shown, a module 500 illustrated in FIG. 26 is mounted on a first main surface of a mother board 400 in a state of being electrically connected to a load 300 via through-hole conductors 560, 562, and 564. On the other hand, a voltage regulator 100 and an inductor L1 are mounted on a second main surface of the mother board 400.

Figure 27:
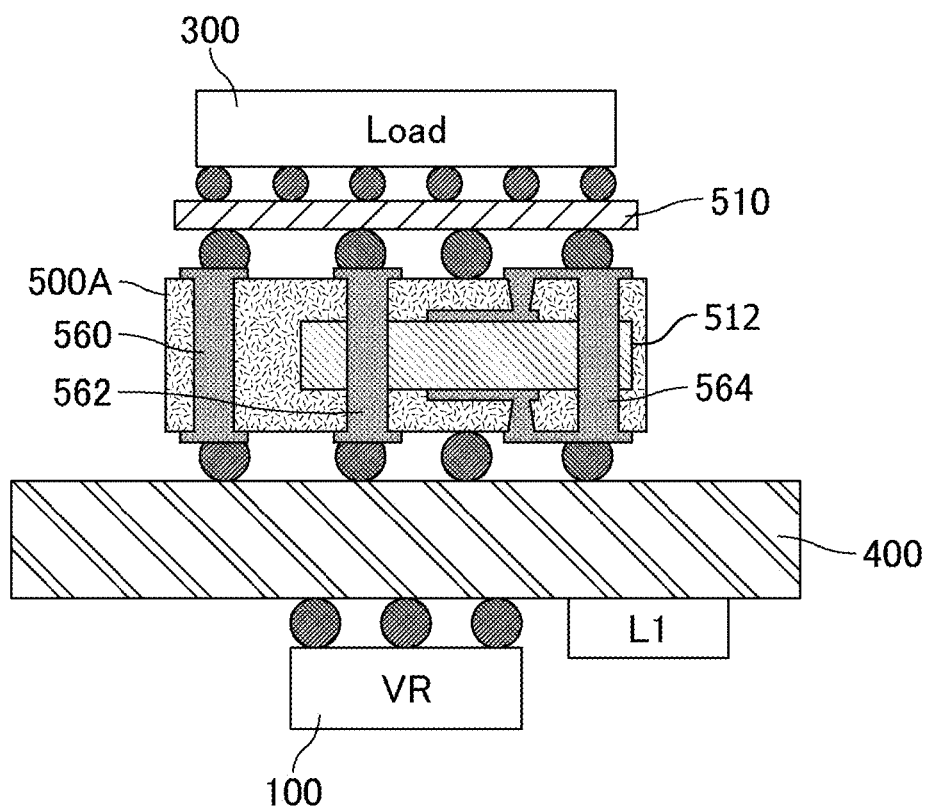
FIG. 27 is a sectional view schematically illustrating a first modification of a module of the exemplary embodiment.

FIG. 27 is a sectional view schematically illustrating a first modification of a module of the exemplary embodiment. As shown, a module 500A illustrated in FIG. 27 is mounted on a first main surface of a mother board 400 in a state of being electrically connected to a load 300 via through-hole conductors 560, 562, and 564 and an interposer board 510. On the other hand, a voltage regulator 100 and an inductor L1 are mounted on a second main surface of the mother board 400.

Figure 28:
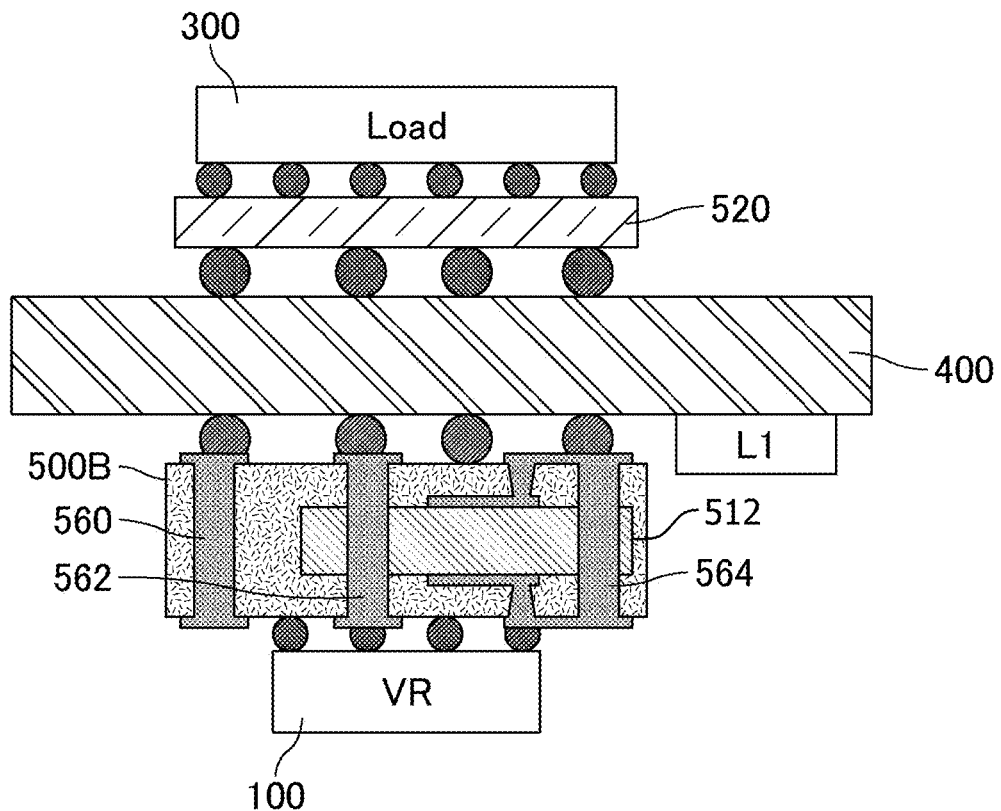
FIG. 28 is a sectional view schematically illustrating a second modification of a module of the exemplary embodiment.

FIG. 28 is a sectional view schematically illustrating a second modification of a module of the exemplary embodiment. As shown, a module 500B illustrated in FIG. 28 is mounted on a second main surface of a mother board 400 in a state of being electrically connected to a voltage regulator 100 via through-hole conductors 560, 562, and 564. An inductor L1 is further mounted on the second main surface of the mother board 400. On the other hand, a package board 520 on which the load 300 is mounted is mounted on a first main surface of the mother board 400.

Figure 29:
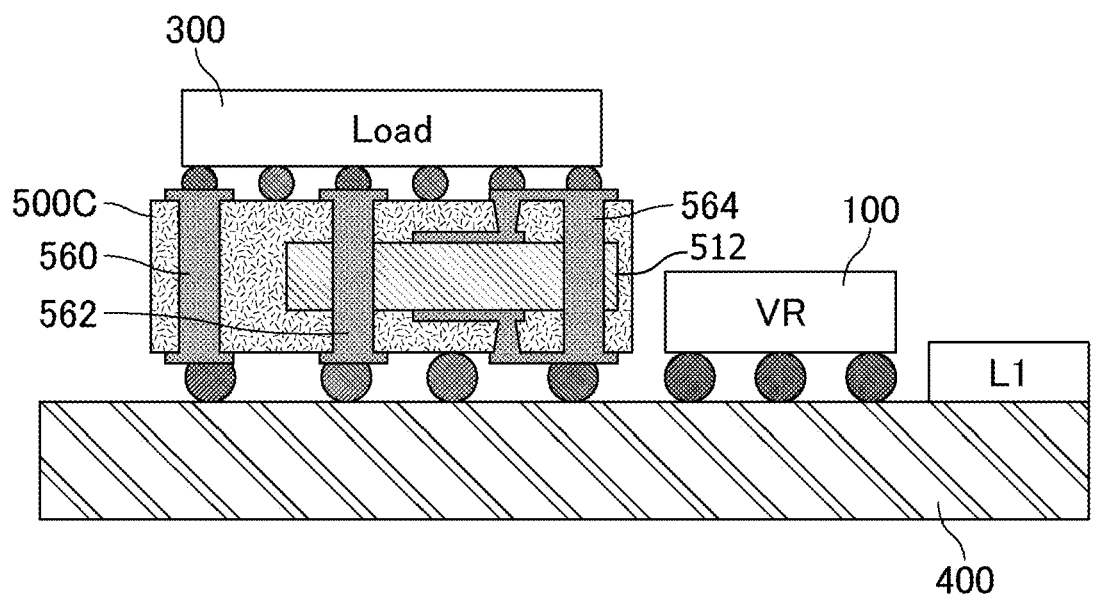
FIG. 29 is a sectional view schematically illustrating a third modification of a module of the exemplary embodiment.

FIG. 29 is a sectional view schematically illustrating a third modification of a module of the exemplary embodiment. As shown, a module 500C illustrated in FIG. 29 is mounted on a first main surface of a mother board 400 in a state of being electrically connected to a load 300 via through-hole conductors 560, 562, and 564. A voltage regulator 100 and an inductor L1 are further mounted on the first main surface of the mother board 400.

Figure 30:
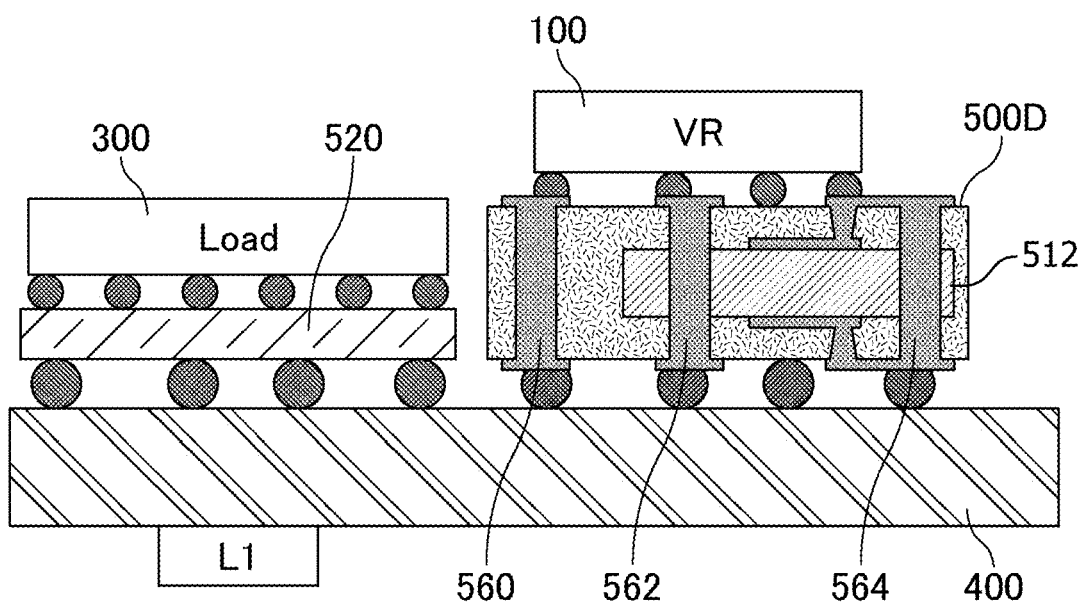
FIG. 30 is a sectional view schematically illustrating a fourth modification of a module of the exemplary embodiment.

FIG. 30 is a sectional view schematically illustrating a fourth modification of a module of the exemplary embodiment. As shown, a module 500D illustrated in FIG. 30 is mounted on a first main surface of a mother board 400 in a state of being electrically connected to a voltage regulator 100 via through-hole conductors 560, 562, and 564. A package board 520 on which a load 300 is mounted is further mounted on the first main surface of the mother board 400. On the other hand, an inductor L1 is mounted on a second main surface of the mother board 400.

As illustrated in FIGS. 26 to 30, the module according to the exemplary embodiments described herein can be mounted on the mother board in a state of being connected to any one of the load and the voltage regulator with the through-hole conductors interposed between the load and the voltage regulator at least in the thickness direction with the through-hole conductors interposed between the load and the voltage regulator. The position for mounting on the mother board may be any position on the mother board. In addition, it should be appreciated that the inductor is not limited to the form of being incorporated in the module of the present invention, and may be mounted on the mother board separately from the module of the present invention.

DESCRIPTION OF REFERENCE SYMBOLS 10, 10A, 10B, 10C: Semiconductor composite device
100: Voltage regulator
120, 380: Solder bump
200, 200A, 200B, 200C, 200D, 200E, 200F, 200G, 200H, 520: Package board
205: Circuit layer
210, 210A: Capacitor layer
212: Conductive layer
220, 240: Conductive portion
222, 242: Via conductor
225: Insulating portion
225A: First insulating portion 225B: Second insulating portion
225C: Third insulating portion
225D: Fourth insulating portion
226, 227, 228: Resin layer
229A: First resin-filled portion
229B: Second resin-filled portion
230: Capacitor portion
231: Anode plate
232: Core portion
234: Porous portion
235: Cutout portion
236: Cathode layer
236A: Carbon layer
236B: Copper layer
250: Inductor layer
252: Coil portion
252: Copper foil
254: Insulating portion
256: Resin
260, 262, 264, 266, 267, 560, 562, 564: Through-hole conductor
261, 263, 265: Through-hole
262A: First through-hole conductor
263A: First through-hole
264A: Second through-hole conductor
265A: Second through-hole
268: Anode connection layer
268A: First anode connection layer
268B: Second anode connection layer
269: Metal layer
270: Terminal layer
300: Load
350: Electronic equipment
400: Mother board
410: Terminal
500, 500A, 500B, 500C, 500D: Module
510: Interposer board
CP1: Capacitor
GND: Ground terminal
IN: Input terminal
L1: Inductor
OUT: Output terminal
X: Anode
Y: Cathode

The invention claimed is:

1. A module for supplying a direct-current voltage adjusted by a voltage regulator including a semiconductor active element to a load, the module comprising:
a capacitor layer that includes at least one capacitor portion that forms a capacitor that includes an anode plate comprising a metal;
a through-hole conductor that penetrates the capacitor portion in a thickness direction of the capacitor layer; and
a connection terminal disposed on a surface of the through-hole conductor and that is configured to provide an electrical connection for at least one of the voltage regulator and the load,
wherein the through-hole conductor electrically connects the capacitor to at least one of the load and the voltage regulator,
wherein the through-hole conductor is interposed between the load and the voltage regulator,
wherein the through-hole conductor includes a first through-hole conductor disposed in at least an inner wall surface of a first through-hole penetrating the capacitor portion in the thickness direction, and
wherein the first through-hole conductor is connected to an end surface of the anode plate over a whole circumference of the first through-hole when viewed in a plan view from the thickness direction.

2. The module according to claim 1, wherein the capacitor layer includes a plurality of the capacitor portions disposed in plane of each other.

3. The module according to claim 1, wherein the capacitor layer includes a plurality of the capacitor portions formed by a divided capacitor sheet.

4. The module according to claim 1, wherein:
the through-hole conductor includes a first through-hole conductor disposed in at least an inner wall surface of a first through-hole penetrating the capacitor portion in the thickness direction, and
the first through-hole conductor is electrically connected to an anode of the capacitor portion.

5. The module according to claim 4, wherein the capacitor portion includes an anode plate including metal, and the first through-hole conductor is connected to an end surface of the anode plate.

6. The module according to claim 5, further comprising:
an anode connection layer disposed between the first through-hole conductor and the end surface of the anode plate,
wherein the first through-hole conductor is connected to the end surface of the anode plate with the anode connection layer interposed between the first through-hole conductor and the end surface of the anode plate, and
wherein, when viewed in section from a direction orthogonal to the thickness direction, a length of the anode connection layer in a direction in which the first through-hole conductor extends is longer than a length of the anode plate in a direction in which the first through-hole conductor extends.

7. The module according to claim 6, wherein, when viewed in section from the direction orthogonal to the thickness direction, the first through-hole conductor of a portion of the anode connection layer protrudes inward in the first through-hole, where another portion of the first through-hole conductor where the anode connection layer is not present does not protrude inward.

8. The module according to claim 4,
wherein the first through-hole is filled with a material containing a resin, and
wherein the material filled in the first through-hole has a thermal expansion coefficient larger than a thermal expansion coefficient of a material forming the first through-hole conductor.

9. The module according to claim 4, wherein:
the through-hole conductor further includes a second through-hole conductor disposed in at least an inner wall surface of a second through-hole penetrating in the thickness direction of the capacitor portion in which the first through-hole conductor is disposed,
the second through-hole conductor is electrically connected to a cathode of the capacitor portion,
the capacitor layer further includes a first insulator stacked on a surface of the capacitor portion and a second insulator stacked on a surface of the first insulating portion,
the capacitor portion includes an anode plate including metal, and
the second insulator extends between the second through-hole conductor and the anode plate.

10. The module according to claim 9, wherein:
the anode plate includes a core portion and a porous portion disposed on at least one main surface of the core portion, and
an insulating material forming the second insulating portion enters a hollow portion of the porous portion.

11. The module according to claim 9, wherein the insulating material that forms the second insulator has a thermal expansion coefficient larger than a thermal expansion coefficient of a material forming the second through-hole conductor.

12. The module according to claim 9, wherein an angle formed by an inner wall surface of the second through-hole formed in the second insulator and an extended surface of a main surface of the anode plate is 90° or more, and is larger than an angle formed by the inner wall surface of the second through-hole formed in the second insulator contacting the core portion of the anode plate and the extended surface of the main surface of the anode plate.

13. The module according to claim 12, wherein:
an angle formed by the inner wall surface of the second through-hole formed in the first insulator and the extended surface of the main surface of the anode plate is 90° or more, and is larger than the angle formed by the inner wall surface of the second through-hole formed in the second insulator contacting the core portion of the anode plate and the extended surface of the main surface of the anode plate, and
an angle formed by the inner wall surface of the second through-hole formed in the second insulator and the extended surface of the main surface of the anode plate is equal to or larger than an angle formed by the inner wall surface of the second through-hole formed in the first insulator and the extended surface of the main surface of the anode plate.

14. The module according to claim 9,
wherein the second through-hole is filled with a material containing a resin, and
wherein the material filled in the second through-hole has a thermal expansion coefficient larger than a thermal expansion coefficient of a material forming the second through-hole conductor.

15. The module according to claim 1, wherein the through-hole conductor includes a third through-hole conductor not connected to either an anode or a cathode of the capacitor portion.

16. A module for supplying a direct-current voltage adjusted by a voltage regulator including a semiconductor active element to a load, the module comprising:
a capacitor layer that includes at least one capacitor portion that forms a capacitor that includes an anode plate comprising a metal;
a through-hole conductor that penetrates the capacitor portion in a thickness direction of the capacitor layer; and
a connection terminal disposed on a surface of the through-hole conductor and that is configured to provide an electrical connection for at least one of the voltage regulator and the load,
wherein the through-hole conductor electrically connects the capacitor to at least one of the load and the voltage regulator,
wherein the through-hole conductor is interposed between the load and the voltage regulator,
wherein the through-hole conductor includes a first through-hole conductor disposed in at least an inner wall surface of a first through-hole penetrating the capacitor portion in the thickness direction,
wherein the first through-hole conductor is electrically connected to an end surface of the anode plate,
wherein the anode plate includes a core portion and a porous portion disposed on at least one main surface of the core portion,
wherein the core portion and the porous portion are exposed on the end surface of the anode plate connected to the first through-hole conductor, and
wherein an outer peripheral length of the first through-hole conductor located at the porous portion is longer than an outer peripheral length of the first through-hole conductor located at the core portion.

17. The module according to claim 16, further comprising an insulating material disposed in a hollow portion of the porous portion.

18. A module for supplying a direct-current voltage adjusted by a voltage regulator including a semiconductor active element to a load, the module comprising:
a capacitor layer that includes at least one capacitor portion that forms a capacitor that includes an anode plate comprising a metal;
a through-hole conductor that penetrates the capacitor portion in a thickness direction of the capacitor layer; and
a connection terminal disposed on a surface of the through-hole conductor and that is configured to provide an electrical connection for at least one of the voltage regulator and the load,
wherein the through-hole conductor includes a first through-hole conductor disposed in at least an inner wall surface of a first through-hole penetrating the capacitor portion in the thickness direction,
wherein the through-hole conductor electrically connects the capacitor to at least one of the load and the voltage regulator,
wherein the through-hole conductor is interposed between the load and the voltage regulator,
wherein the first through-hole conductor is electrically connected to an end surface of the anode plate,
wherein the capacitor layer further includes a first insulator stacked on a surface of the capacitor portion and a second insulator stacked on a surface of the first insulator, and
wherein an angle formed by the inner wall surface of the first through-hole formed in the second insulator and an extended surface of a main surface of the anode plate is 90° or more, and is larger than an angle formed by the inner wall surface of the first through-hole formed in the core portion of the anode plate and the extended surface of the main surface of the anode plate.

19. The module according to claim 18, wherein:
an angle formed by the inner wall surface of the first through-hole formed in the first insulator and the extended surface of the main surface of the anode plate is 90° or more, and is larger than the angle formed by the inner wall surface of the first through-hole formed in the core portion of the anode plate and the extended surface of the main surface of the anode plate, and
an angle formed by the inner wall surface of the first through-hole formed in the second insulator and the extended surface of the main surface of the anode plate is equal to or larger than an angle formed by the inner wall surface of the first through-hole formed in the first insulator and the extended surface of the main surface of the anode plate.

* * * * *